(12) United States Patent
Gong et al.

(10) Patent No.: US 8,076,842 B2
(45) Date of Patent: *Dec. 13, 2011

(54) MULTILAYER POLYMER LIGHT-EMITTING DIODES FOR SOLID STATE LIGHTING APPLICATIONS

(75) Inventors: Xiong Gong, Goleta, CA (US); Alan J. Heeger, Santa Barbara, CA (US); Daniel Moses, Santa Barbara, CA (US); Guillermo C. Bazan, Santa Barbara, CA (US); Shu Wang, Beijing (CN)

(73) Assignee: The Regents of the University of California, Oakland, CA (US)

( * ) Notice: Subject to any disclaimer, the term of this patent is extended or adjusted under 35 U.S.C. 154(b) by 1660 days.

This patent is subject to a terminal disclaimer.

(21) Appl. No.: 11/366,186

(22) Filed: Mar. 1, 2006

(65) Prior Publication Data

US 2006/0202616 A1  Sep. 14, 2006

Related U.S. Application Data

(63) Continuation-in-part of application No. 10/680,084, filed on Oct. 6, 2003, now Pat. No. 7,830,085.

(51) Int. Cl.
*H01L 51/54* (2006.01)
*H01L 51/56* (2006.01)

(52) U.S. Cl. ........ 313/506; 313/504; 428/690; 428/917; 257/40

(58) Field of Classification Search .................. None
See application file for complete search history.

(56) References Cited

U.S. PATENT DOCUMENTS 4,948,843 A  8/1990  Roberts et al.
(Continued)

FOREIGN PATENT DOCUMENTS

JP  2003-251832  9/2003
(Continued)

OTHER PUBLICATIONS

Balakin, K.V. et al. Conjugates of oligonucleotides with polyaromatic fluorophores as promising DNA probes[1]; *Biosensors and Bioelectronics* (1998) 13:771-778.

(Continued)

*Primary Examiner* — Angela Ortiz
*Assistant Examiner* — Camie Thompson
(74) *Attorney, Agent, or Firm* — Berliner & Associates

(57) ABSTRACT

Multilayer polymer light-emitting diodes (PLEDs) are demonstrated using semiconducting polymers blended with organometallic emitters as the emissive layer and one or both of an electron transport layer and a hole transparent layer on the appropriate electron injection and hole injection sides of the emissive layer. The transport layers reduce energy potential gaps between the hole injection electrode and the emissive polymer and between the electron injection electrode and the emissive polymer. A solvent-processing based procedure for preparing these devices is also disclosed It uses nonpolar solvent-based solutions of emissive polymers to form the emissive layer and polar solvent-based solutions to form the transport layers to minimize etching and other undesirable interactions as the multiple layers are being laid down. Illumination quality white light can be obtained with stable Commission Internationale de l'Eclairage coordinates, stable color temperatures, and stable color rendering indices, all close to those of "pure" white light. These multilayer white light-emitting PLEDs are useful as backlights for liquid crystal displays and for solid state lighting applications.

33 Claims, 8 Drawing Sheets

U.S. PATENT DOCUMENTS

| | | | |
|---|---|---|---|
| 4,950,587 | A | 8/1990 | Roberts et al. |
| 5,408,109 | A | 4/1995 | Heeger et al. |
| 5,612,221 | A | 3/1997 | Simons et al. |
| 5,869,350 | A | 2/1999 | Heeger et al. |
| 5,881,083 | A | 3/1999 | Diaz-Garcia et al. |
| 5,968,762 | A | 10/1999 | Jadamec et al. |
| 5,990,479 | A | 11/1999 | Weiss et al. |
| 6,083,635 | A | 7/2000 | Jonas et al. |
| 6,280,933 | B1 | 8/2001 | Glazer et al. |
| 6,476,184 | B1 | 11/2002 | Janietz et al. |
| 6,534,329 | B2 | 3/2003 | Heeger et al. |
| 6,692,663 | B2 | 2/2004 | Zhou |
| 6,743,640 | B2 | 6/2004 | Whitten |
| 6,849,869 | B1 * | 2/2005 | O'Regan et al. ............... 257/40 |
| 6,869,695 | B2 * | 3/2005 | Thompson et al. ........... 428/690 |
| 6,872,474 | B2 * | 3/2005 | Sakakibara et al. .......... 428/690 |
| 2002/0009728 | A1 | 1/2002 | Bittner |
| 2002/0022689 | A1 | 2/2002 | Menon |
| 2002/0034747 | A1 | 3/2002 | Bruchez |
| 2002/0064680 | A1 | 5/2002 | Spreitzer et al. |
| 2002/0150759 | A1 | 10/2002 | Jones |
| 2002/0177136 | A1 | 11/2002 | McBranch |
| 2003/0054413 | A1 | 3/2003 | Kumaraswamy |
| 2003/0059975 | A1 | 3/2003 | Sirringhaus et al. ............ 438/99 |
| 2003/0222250 | A1 | 12/2003 | Hsu .............................. 252/500 |
| 2004/0241768 | A1 | 12/2004 | Whitten |
| 2005/0073245 | A1 | 4/2005 | Gong et al. |

FOREIGN PATENT DOCUMENTS

| | | |
|---|---|---|
| JP | 2003-257647 | 9/2003 |
| WO | WO 97/33323 | 9/1997 |
| WO | WO 99/35288 | 7/1999 |
| WO | WO 00/14278 | 3/2000 |
| WO | WO 00/66790 | 11/2000 |
| WO | WO01/77203 | 10/2001 |
| WO | WO 02/81735 | 10/2002 |
| WO | WO/04/001379 | 12/2003 |
| WO | WO2004/037886 | 5/2004 |
| WO | WO2005/056628 | 6/2005 |

OTHER PUBLICATIONS

Bardea, A. et al. Sensing and amplification of oligonucleotide-DNA interactions by means of impedance spectroscopy: a route to a Tay-Sachs sensor; *Chem. Commun.* (1999) 21-22.

Baur, J.W., et al. Thin-Film Light-Emitting Devices Based on Sequentially Adsorbed Multilayers of Water-Soluble Poly(p-phenylene)s; *Advanced Materials* (1998) 10:17:1452-1455.

Behr, J.P. Synthetic Gene-Transfer Vectors; *Acc. Chem. Res.* (1993) 26: 274-278.

Behr, J.P. DNA Strongly Binds to Micelles and Vesicles Containing Lipopolyamines or Lipointercalants; *Tetrahedron Lett.* (1986) 27:48:5861-5864.

Benson, S.C. et al. Heterodimeric DNA-binding dyes designed for energy transfer: synthesis and spectroscopic properties; *Nucleic Acids Res.* (1993) 21:24:5727-5735.

Betts, L, et al. A Nucleic Acid Triple Helix Formed by a Peptide Nucleic Acid-DNA Complex; *Science* (1995) 270: 1838-1841.

Bhattacharya, S. and Mandal, S.S. Interaction of surfactants with DNA. Role of hydrophobicity and surface charge on intercalation and DNA melting; *Biochim.et Biophys. Acta.* (1997) 1323:29-44.

Bhattacharya. S. and Mandal, S.S. Role of hydrophobic effect and surface charge in surfactant-DNA association; *Indian J. Biochem. & Biophys.* (1997) 34:11-17.

Bier, F.F. and Kleinjung, F. Feature-size limitations of microarraY technology—a critical review, *Fresenius J. Anal. Chem.* (2001) 371:151-156.

Birnboim, H.C. and Jevcak, J.J. Fluorometric Method for Rapid Detection of DNA Strand Breaks in Human White Blood Cells Produced by Low Doses of Radiation; *Cancer Res.* (1981) 41:1889-1892.

Blessing, T. et al. Monomolecular collapse of plasmid DNA Into stable virus-like particles; *Proc. Natl. Acad. Sci. USA* (1998) 95:1427-1431.

Bronich, T.K. et al. Recognition of DNA Topology in Reactions between Plasmid DNA and Cationic Copolymers; *J. Am. Chem. Soc.* (2000) 122:35:8339-8343.

Cardullo, R.A. et al. Detection of nucleic acid hybridization by nonradiative fluorescence resonance energy transfer; *Proc. Natl. Acad. Sci. USA* (1988) 85:8790-8794.

Castro, A. and Williams, J.G.K. Single-molecule detection of specific nucleic acid sequences in unamplified genomic DNA; *Anal. Chem.* (1997) 69:19:3915-3920.

Chandar, P. et al. Fluorescence probe investigation of anionic polymer-cationic surfactant interactions; *Macromolecules* (1988) 21:950-953.

Chehab, F.F. and Kan, Y.W. Detection of specific DNA sequences by fluorescence amplification: A color complementation assay; *Proc. Natl. Acad. Sci. USA* (1989) 86:9178-9182.

Chen, L. and Frankel, A.D. A peptide interaction in the major groove of RNA resembles protein interactions in the minor groove of DNA; *Proc. Natl. Acad. Sci. USA.* (1995) 92:5077-5081.

Chen, L. et al. Highly sensitive biological and chemical sensors based on reversible fluorescence quenching in a conjugated polymer; *Proc. Natl. Acad. Sci. USA.* (1999) 96:22:12287-12292.

Chen, W. et al. Using Ethidium Bromide to Probe the Interactions between DNA and Dendrimers; *Langmuir* (2000) 16:15-19.

Delling, U. et al. The Number of positively charged amino acids in the basic domain of Tat is critical for trans-activation and complex formation with TAR RNA; *Proc. Nad. Acad. Sci. USA* (1991) 88:6234-6238.

Demidov, V.V. PNA and LNA throw light on DNA; *Trends in Biotechnology* (2003) 21:1:4-7.

Demidov, V.V. et al. Stability of peptide nucleic acids in human serum and cellular extracts; *Biochem. Phaimacol.* (1994) 48:6:1310-1313.

Didenko, V.V. DNA Probes Using Fluorescence Resonance Energy Transfer (FRET): Designs and Applications; *BioTechniques* (2001) 31:5:1106-1121.

Dogariu, A. et al. Time-resolved Förster energy transfer in polymer blends; *Synthetic Metals* (1999) 100:95-100.

Dufourcq, J. et al. Molecular assembling of DNA with amphipathic peptides; *FEBS Lett.* (1998) 421:7-11.

Eastman, S.J. et al. Biophysical characterization of cationic lipid: DNA complexes; *Biochim. et Biophys. Acta* (1997) 1325:41-62.

Egholm, M. et al. PNA hybridizes to complementary oligonucleotides obeying the Watson-Crick hydrogenbonding rutes; *Nature* (1993) 365:566-568.

Egholm, M. et al. Recognition of Guanine and Adenine in DNA by Cytosine and Thymine Containing Peptide Nucleic Acids (PNA); *J. Am. Chem. Soc.* (1992) 114:9677-9678.

Englebienne, P. Synthetic materials capable of reporting biomolecular recognition events by chromic transition; *J. Mater Chem.* (1999) 9:1043-1054.

Eskilsson, K. et al. DNA-Surfactant Complexes at Solid Surfaces; *Langmuir* (2001) 17:1666-1669.

Felgner, P.L. et al. Nomenclature for Synthetic Gene Delivery Systems; *Hum. Gene Ther.* (1997) 8:511-512.

Ferguson; B.Q. and Yang. D.C.H. Localization of Noncovalently Bound Ethidium in Free and Methionyl-tRNA Synthetase Bound tRNA$^{fMet}$ by Singlet-Singlet Energy Transfer, *Biochemistry* (1986) 25:5298-5304.

Fernandez-Saiz, M. et al. A Cationic Cydophane That Forms a Base-Pair Open Complex with RNA Duplexes; *J. Am. Chem. Soc.* (1996) 118:4739-4745.

Frankel, A.D. Peptide models of the Tat-TAR protein-RNA interaction; *Prot. Sci.* (1992) 1:1539-1542.

Futami, J. et al. Optimum Modification for the Highest Cytotoxicity of Cationized Ribonudease; *J. Biochem.* (2002) 132:223-228.

Gallego, J. and Varani, G. Targeting RNA with Small-Molecule Drugs: Therapeutic Promise and Chemical Challenges; *ACC. Chem. Res.* (2001) 34:10:835-843.

Gallo, R and Montagnier, L. AIDS in 1988; *Sci. Am.* (1988) 259:4:41-48.

Ganachaud, F. et al. Adsorption of Single-Stranded DNA Fragments onto Cationic Aminated Latex Particles; *Langmuir* (1997) 13:701-707.

Gaylord, B. S. et al. DNA detection using water-soluble conjugated polymers and peptide nucleic acid probes; *Proc. Natl. Acad. Sci. USA* (2002) 99:17:10954-10957.

Gaylord, B.S. et al. Water-Soluble Conjugated Oligomers: Effect of Chain Length and Aggregation on Photoluminescence-Quenching Efficiencies; *J. Am. Chem. Soc.* (2001) 123:6417-6418.

Gaylord, B.S. et al. DNA Hybridization Detection with Water-Soluble Conjugated Polymers and Chromophore-Labeled Single-Stranded DNA; *J. Am. Chem. Soc.* (2003) 125:896-900.

Gershon, H. et al. Mode of Formation and Structural Features of DNA-Cationic Liposome Complexes Used for Transfection; *Biochemistry* (1993) 32:7143-7151.

Giesen, U. et al. A formula for thermal stability ($^T$m) prediction of PNA/DNA duplexes; *Nucleic Acids Res.* (1998) 26:21:5004-5006.

Gössl, L. et al. Molecular Structure of Single DNA Complexes with Positively Charged Dendronized Polymers; *J. Am. Chem. Soc.* (2002)124:6860-6865.

Hage, D.S.. Immunoassays; *Anal. Chem.* (1999) 71:12:294R-304R.

Hanvey, J.C. et al. Antisense and Antigene Properties of Peptide Nucleic Acids: *Science* (1992)258:1481-1485.

Harada, A. and Kataoka, K. Chain Length Recognition: Core-Shall Supramolecular Assembly from Oppositely Charged Block Copolymers; *Science* (1999) 283:65-67.

Ho, H.A. et al. Colorimetric and Fluorometric Detection of Nucleic Acids Using Cationic Polythiophene Deriatives; *Angew. Chem. Int. Ed.* (2002) 41:9:1548-1551.

Izumrudov, V.A. et al. The influence of chain length of a competitive polyanion and nature of monovalent counterions on the direction of the substitution reaction of polyelectrolyte complexes; *Makromol. Chem., Rapid Commun.* (1988) 9:7-12.

Izumrudov, V.A. et al. Competitive Reactions in Solutions of DNA and Water-Soluble Interpolyelectrolyte Complexes; *Biopolymers* (1995) 35:523-531.

Izumrudov, V.A. et al. Competitive Displacement of Ethidium Cations Intercalated in DNA by Polycations; *Dokl. Phys. Chem.* (1995) 342:Nos. 4-6: 150-153.

Izumrudov, V.A. et al. Ethidium Bromide as a Promising Probe for Studying DNA Interaction with Cationic Amphiphiles and Stability of the Resulting Complexes; *Langmuir* (2002) 18:10348-10356.

Izumrudov, V.A. et al. Controllable Stability of DNA-Containing Polyelectrolyte Complexes in Water-Salt Solutions; *Biopolymers.* (1999) 52:94-108.

Izumrudov, V.A. and Zhiryakova M.V. Stability of DNA-containing interpolyelectrolyte complexes in water-salt solutions; *Macromol. Chem. Phys.* (1999) 200:11:2533-2540.

Jain, C. and Belasco, J.G. Rapid Genetic Analysis of RNA-Protein Interactions by Translational Repression in *Escherichia coli*; *Methods Enzymol.* (2000) 318:309-332.

Jenkins, Y. and Barton, J.K. A Sequence-Specific Molecular Light Switch: Tethering of an Oligonucleotide to a Dipyridophenazine Complex of Ruthenium (II); *J. Am. Chem. Soc.* (1992) 114:8736-8738.

Johansson, M.K. et al. Intramolecular Dimers: A New Strategy to Fluorescence Quenching in Dual-Labeled Oligonucleotide Probes; *J. Am. Chem. Soc.* (2002) 124:6950-6956.

Kabanov, A.V. et al. DNA Interpolyelectrolyte Complexes as a Tool for Efficient Cell Transformation; *Biopolymers.* (1991) 31:1437-1448.

Kabanov, A.V. and Kabanov, V.A. DNA Complexes with Polycations for the Delivery of Genetic Material into Cells; *Bioconjugate Chem.* (1995) 6:7-20.

Kabanov, V.A. et al. Cooperative Interpolyelectrolyte Reactions; *Makromol. Chem. Suppl.* (1985) 13:137-155.

Karn, J. et al. HIV A Practical Approach; RNA binding assays for the regulatory proteins Tat and Rev; *IRL Press*, New York; (1995) 9:147-165.

Katayose, S. and Kataoka, K. Water-Soluble Polyion Complex Associates of DNA and Poly(ethylene glycol)-Poly($_L$-lysine) Block Copolymer, *Bioconjugate Chem.* (1997) 8:702-707.

Kircheis, R. et al. Tumor targeting with surface-shielded ligand-polycation DNA complexes; *J. Controlled Release*; (2001) 72:165-170.

Kirsh, Yu. E. et al. Comparison of Properties of an Oxime-Bound Partially Quaternized Poly-4-Vinylpyridine and a Monomer Analogous Oxime; *Eur. Polym. J.* (1974) 10:393-399.

Knemeyer, J. et al. *Probes for Detection of Specific DNA, Anal. Chem.* (2000) 72:3717-3724.

Kwon, I.C. et al. Electrically Erodible polymer gel for controlled release of drugs; *Nature* (1991) 354:291-293.

Leclerc M. Optical and Electrochemical Transducers Based on Functionalized Conjugated Polymers; *Adv. Mater*, (1999) 11:18:1491-1498.

Lee, M.A. et al. ResonSense®: simple linear fluorescent probes for quantitative homogeneous rapid polymerase chain reaction; *Anal. Chim. Acta* (2002) 457:61-70.

Le-Pecq, J.B. and Paoletti, C. A Fluorescent Complex between Ethidium Bromide and Nucleic Acids; *J. Mol Biol.* (1967) 27:87-106.

Leulliot, N. and Varani, G. Current Topics in RNA-Protein Recognition: Control of Specificity and Biological Function through Induced Fit and Conformational Capture; *Biochemistry* (2001) 40:27:7947-7956.

Liu, B. et al. Effect of Chromophore-Charge Distance on the Energy Transfer Properties of Water-Soluble Conjugated Oligomers; *J. Am. Chem. Soc.* (2003) 125:6705-6714.

Makino, S. et al. Molecular Characterization and Protein Analysis of the *cap* Region, Which is Essential for Encapsulation in *Bacillus anthracis*; *J. Bacteria* (1989) 171:2:722-730.

Manning, G.S. Thermodynamic Stability Theory for DNA Doughnut Shapes Induced by Charge Neutralization; *Biopolymers.* (1980) 19:37-59.

Manning, G.S. The Possibility of Intrinsic Local Curvature in DNA Toroids; *Biopolymers.* (1981) 20:1261-1270.

Manning, G.S. The molecular theory of polyetectrolyte solutions with applications to the electrostatic properties of polynucleotides; *Qrtly Review of Biophysics.* (1978) v.11: 179-246.

Maruyama, A. et al. Characterization of Interpolyelecholyte Complexes between Double-Stranded DNA and Polylysine Comb-Type Copolymers Having Hydrophilic Side Chains; *Bioconjugate Chem.* (1998) 9:292-299.

Matsumoto, C; et al. High-Throughput Screening Utilizing Intramolecular Fluorescence Resonance Energy Transfer for the Discovery of the Molecules that Bind HIV-1 TAR RNA Specifically; *Bioorg. Med. Chem. Lett.* (2000) 10:1857-1861.

McLoughlin, D.M. et al. A simple and effective separation and purification procedure for DNA fragments using Dodecyltrimethylammonium bromide; *Bioseparation.* (2001) 9:307-313.

McQuade, D.T. et al. Conjugated Polymer-Based Chemical Sensors; *Chem. Rev.* (2000) 100:2537-2574.

McQuade, D.T. et al. Signal amplification of a "Turn-On" Sensor. Harvesting the Light Captured by a Conjugated Polymer, *J. Am. Chem. Soc.* (2000)122:12389-12390.

Mel'Nikov, S.M. et al. Discrete Coil—Globule Transition of Large DNA Induced by Cationic Surfactant; *J. Am. Chem. Soc.* (1995) 117:2401-2408.

Mergny, J.L. et al. Fluorescence Energy Transfer between Two Triple Helix-Forming Oligonucleotides Bound to Duplex DNA; *Biochemistry.* (1994) 33:15321-15328.

Miao, Y.J. et al. Photophysics of Poly(paracyclophan-1-ene) and Derivatives: Evidence for Intrachain Energy Transfer and Chromophore Aggregation; *J. Am. Chem. Soc.* (1995)117:11407-11420.

Miller, I.R. and Bach, D. Interaction of DNA with Heavy Metal Ions and Polybases: Cooperative Phenomena; *Biopolymers.* (1968) 6:169-179.

Minehan, D.S. et al. Knetics of DNA Binding to Electrically Conducting Polypyrrole Films; *Macromolecules.* (1994) 27:777-783.

Morgan, A.R. and Pulleyblank, D.E. Native and Denatured DNA, Cross-Linked and Palindromic DNA and Circular Covalerty-Closed DNA Analysed by a Sensitive Fluorometric Procedure; *Biochem. Biophys. Res. Commun.* (1974) 61:2:396-403.

Nielsen, P.E. Applications of peptide nucleic adds, *Analytical biotechnology.* (1999) 10:71-75.

Nguyen, H-K, et al. Nonviral Transfer Technology: Evaluation of polyether-polyethyleneimine graft copolymers as gene transfer agents; *Gene Ther.* (2000) 7:126-138.

Nishanian, P. et al. A Simple Method for Improved Assay Demonstrates that HIV p24 Antigen is Present as Immune Complexes in Most Sera from HIV-Infected Individuals; *J. Infect. Dis.* (1990) 162:21-28.

Nuovo, G.J. In Situ Localization of PCR-Amplified DNA and cDNA; *Methods Mol. Bio.* (2000) 123:217-238.

Olins, D.E. at al. Model Nucleoprotein Complexes: Studies on the Interaction of Cationic Homopolypeptides with DNA; *J. Mol. Biol.* (1967) 24:157-176.

Pasternack, R.F. et al. Long-Range Fluorescence Quenching of Ethidium Ion by Cationic Porphyrins in the Presence of DNA; *J. Am. Chem. Soc.* (1991) 113:6835-6840.

Patolsky, F. et al. Amplified DNA Detection by Electrogenerated Biochemiluminescence and by the Catalyzed Precipitation of an Insoluble Product on Electrodes in the Presence of the Doxorubicin Intercalator; *Angew. Chem. Int. Ed.* (2002) 41:18:3398-3402.

Patolsky, F. et al. Electronic Transduction of DNA Sensing Processes on Surfaces: Amplification of DNA Detection and Analysis of Single-Base Mismatches by Tagged Liposomes; *J. Am Chem. Soc.* (2001) 123:5194-5205.

Petty, J.T. et al. Thermodynamic Characterization of the Association of Cyanine Dyes with DNA; *J. Phys. Chem. B.* (2000) 104:7221-7227.

Pilipenko, E.V. et al. A cell cycle-dependent protein serves as a template-specific translation initiation factor; *Genes & Dev.* (2000) 14:2028-2045.

Pinto, M.R. and Schanze, K.S. Conjugated Polyelectrolytes: Synthesis and Applications; *Synthesis.* (2002) 9:1293-1309.

Plank, C. et al. Branched Cationic Peptides for Gene Delivery: Role of Type and Number of Cationic Residues in Formation and in Vitro Activity of DNA Polyplexes; *Hum. Gene Ther.* (1999) 10:319-332.

Portela, A. and Digard, P. The influenza virus nucleoprotein: a multifunctional RNA-binding protein pivotal to virus replication; *J. Gen. Virol.* (2002) 83:723-734.

Puglisi, J.D. et al. Conformation of the TAR RNA-Arginine Complex by NMR Spectroscopy; *Science.* (1992) 257:76-80.

Pullman, B. et al. Two Aspects of DNA Polymorphism and Microheterogeneity: Molecular Electrostatic Potential and Steric Accesibility; *J. Biochem.* (1982) 124:229-238.

Richter, S. et al. Specific HIV-1 TAR RNA Loop Sequence and Functional Groups are Required for Human Cyclin T1-Tat-TAR Ternary Complex Formation; *Biochemistry.* (2002) 41:6391-6397.

Saghatelian, A. et al. DNA Detection and Signal Amplification via an Engineered Allosteric Enzyme; *J. Am. Chem. Soc.* (2003) 125:344-345.

Saiki, R.K. et al. Enzymatic Amplification of β-Globin Genomic Sequences and Restriction Site Analysis for Diagnosis of Sickle Cell Enemia; *Science.* (1985) 230:1350-1354.

Schork, N.J. et al. Single nucleotide polymorphisms and the future of genetic epidemiology; *Clin. Genet* (2000) 58:250-264.

Seymour, L.W. et al. Cationic block copolymers as self-assembling vectors for gene delivery; *Self-assembling Complexes for Gene Delivery;* (1998) 11:219-239.

Shinozuka, K. et al. A Novel Multifunctionalily Labelled DNA Probe Bearing an Intercalator and a Fluorophore; *J. Chem. Soc., Chem. Commun.* (1994) 1377-1378.

De Smedt, S.C. et al. Cationic Polymer Based Gene Delivery Systems; *Pharm. Res.* (2000) 17:2:113-126.

Smith, J.O. et al. Molecular Recognition of PNA-Containing Hybrids: Spontaneous Assembly of Helical Cyanine Dye Aggregates on PNA Templates; *J. Am. Chem. Soc.* (1999) 121:2686-2695.

Smith, P. et al. Surfactant structure around DNA in aqueous solution; *Phys. Chem. Chem. Phys.* (2000) 2:1305-1310.

Stender, H. et al. PNA for rapid microbiology; *J. Microbiological Methods.* (2002) 48:1-17.

Stork, M. et al. Energy Transfer in Mixtures of Water-Soluble Oligomers: Effect of Charge, Aggregation, and Surfactant Complexation; *Adv. Mater.* (2002) 14:5:381-366.

Su, X et al. Au nanoparticle- and silver-enhancement reaction-amplified microgravimetric biosensor, *Chem. Commun.* (2001) 755-756.

Sullenger, B.A. and Gilboa, E. Emerging clinical applications of RNA; *Nature.* (2002) 418:252-258.

Takakusa, H. et al. Design and Synthesis of an Enzyme-Cleavable Sensor Molecule for Phosphodiesterase Activity Based on Fluorescence Resonance Energy Transfer; *J. Am. Chem. Soc.* (2002) 124:8:1653-1657.

Tamilarasu, N. et al. A New strategy for Site-Specific Protein Modification: Analysis of a Tat Peptide-TAR RNA Interaction; *Bioconjugate Chem.* (2001) 12:2:135-138.

Tang, M.X. and Szoka, F.C. The influence of polymer structure on the interactions of cationic polymers with DNA and morphology of the resulting complexes; *Gene Ther.* (1997) 4:823-832.

Demers, L.M. et al. Thermal Desorotion: J. Am. Chem. Soc. (2002) 124, 11248-11748.

Taton, T.A. et al. Scanometric DNA Array Detection with Nanoparticle Probes; *Science.* (2000) 289:1757-1760.

Taton, T.A. et al. Two-Color Labeling of Oligonucleotide Arrays via Size-Selective Scattering of Nanoparticle Probes; *J. Am. Chem. Soc.* (2001) 123:5164-5165.

Tomac, S. et al. Ionic Effects on the Stability and Conformation of Peptide Nucleic Acid Complexes; *J. Am. Chem. Soc.* (1996) 118:5544-5552.

Traser, S. et al. Syntheses and solution properties of water-soluble poly(p-phenylene)s bearing oligo(ethylene oxide) and trialkylamino side groups; *e-Polymers.* (2002) 32:1-39.

Umek, R.M. et al. Electronic Detection of Nucleic Acids—A Versatile Platform for Molecular Diagnostics; *J. Mol. Diag.* (2001) 3:2:74-84.

Vaishnav, Y.N. and Wong-Staal, F. The Biochemistry of Aids; *Ann. Rev. Biochem.* (1991) 60:577-630.

Varani, G. RNA-Protein Intermolecular Recognition; *Acc. Chem. Res.* (1997) 30:5:189-195.

Vinogradov, S.V. et al. Self-Assembly of Polyamine-Poly(ethylene glycol) Copolymers with Phosphorothioate Oligonucleotides; *Bioconjugate Chem.* (1998) 9:805-812.

Wang, J. et al. Photoluminescence of Water-Soluble Conjugated Polymers: Origin of Enhanced Quenching by Charge Transfer; *Macromolecules.* (2000) 33:5153-5158.

Wang, J. et al. DNA Electrochemical Biosensor for the Detection of Short DNA Sequences Related to the Human Immunodeficiency Virus; *Anal. Chem.* (1996) 68:15:2629-2634.

Isola, N. R. et al. Surface-Enhanced Raman Gene Probe for HIV Detection; *Anal. Chem.* (1998) 70:1352-1356.

Wang, J. Survey and Summary From DNA biosensors to gene chips; *Nucleic Acid Res.* (2000) 28:16:3011-3016.

Wang, J. et al. Dendritic Nucleic Acid Probes for DNA Biosensors; *J. Am. Chem. Soc.* (1998) 120:8281-8282.

Wang, J. et al. Synthesis of AB(BA), ABA and BAB Block Copolymers of *tert*-Butyl Methacrylate (A) and Ethylene Oxide (B); *J. Polym. Sci., Part A: Polym. Chem.* (1992) 30:2251-2261.

Wang, Y. et al. Inte raction of DNA with Cationic Micelles: Effects of Micelle Surface Charge Density, Micelle Shape, and Ionic Strength on Complexation and DNA Collapse; *Langmuir.* (2001) 17:1670-1673.

Waring, M. J. Complex Formation between Ethidium Bromide and Nucleic Acids; *J. Mol. Biol.* (1965) 13:269-282.

Weeks. K.M. et al. Fragments of the HIV-1 Tat Protein Specifically Bind TAR RNA; *Science.* (1990) 249:1281-1285.

Whitcombe, D. et al. Detection of PCR products using self-probing amplicons and fluorescence; *Nat. Biotechnol.* (1999) 17:804-807.

Wolfert, M.A. et al. Polyelectrolyte Vectors for Gene Delivery Influence of Cationic Polymer on Biophysical Properties of Complexes Formed with DNA; *Bioconjugate Chem.* (1999) 10:993-1004.

Wyman, T.B. et al. Design, Synthesis, and Characterization of a Cationic Peptide that Binds to Nucleic Acids and Permeabilizes Bilayers; *Biochemistry.* (1997) 36:3008-3017.

Xu, X.H. and Bard, A.J. Immobilization and Hybridization of DNA on an Aluminum(III) Alkanebisphosphonate Thin Film with Electrogenerated Chemiluminescent Detection; *J. Am. Chem. Soc.* (1995) 117:2627-2631.

Yang, J.S. and Swager, T.M. Fluorescent Porous Polymer Films as TNT Chemosensors: Electronic and Structural Effects; *J. Am. Chem. Soc.* (1998) 120:11864-11873.

Junhui, Z. et al. DNA Based Biosensors; *Biotechnol. Adv.* (1997) 15:43-58.

Jian Wang, et al. "Photoluminescence of water-soluble conjugated polymers: origin of enhanced quenching by charge transfer" *Macromolecules*, vol. 33, (2000), pp. 5153-5158.

Bin Liu, et al. "Effect of chromophore-charge distance on the energy transfer properties of water-soluble conjugated oligomers" *Journal of the American Chemical Society*, vol. 125, (203) pp. 6706-5-6714.

Bin Liu, et al. "Shape-adaptable water-soluble conjugated polymers" *Journal of the American Chemical Society*, vol. 125, (203) pp. 13306-13307.

Shu Wang, Guillermo Bazan, "Solvent-dependent aggregation of a water-soluble poly(fluorine) controls energy transfer to chromophore-labeled DNA" *Chem. Commun.* (2004) pp. 2508-2509.

Bin Liu, et al. "Synthesis of novel cationic water-soluble efficient blue photoluminescent conjugated polymer" *Chem. Commun.* (2000), pp. 551-552.

Bin Liu, et al. "Blue-light-emitting cationic water-soluble polyfluorene derivatives with tunable quaternization degree" *Macromolecules.* vol. 35 (2002), pp. 4975-4982.

Martin Stork, et al. "Energy transfer ix mixtures of water-soluble oligomers: effect of charge, aggregation and surfactant complexation" *Advanced Materials* vol. 14, No. 5 (2002) pp. 361-366.

Fei Huang, et al. "Novel electroluminescent conjugated polyelectrolytes based on polyfluorene" *Chem. Mater.*, vol. 16 (2004) pp. 708-716.

Wang et al., "Size-Specific Interactions Between Single- and Double-Stranded Oligonucleotides and Cationic Water-Soluble Oligofluorenes", Adv. Funct. Mater., Jun. 2003, 13(6), 463-467.

Stork et al., "Energy Transfer in Mixtures of Water-Soluble Oligomers: Effect of Charge, Aggregation, and Surfactant Complexation", Adv. Mater., Mar. 2002, 14(5), 361-366.

Leclerc, "Optical and Electrochemical Transducers Based on Functionalized Conjugated Polymers", Adv. Mater., 1999, 11(18), 1491-1498.

Balakin et al., "Conjugates of oligonucleotides with polyaromatic fluorophores as promising DNA probes", Biosensors & Bioelectronics, 1998, 13, 771-778.

Ho et al., "Colorimetric and Fluormetric Detection of Nucleic Acids Using Cationic Polythiophene Derivatives", Angew. Chem. Int. Ed., 2002, 41(9), 1548-1551.

McQuade et al., "Conjugated Polymer-Based Chemical Sensors", Chem. Rev., 2000, 100, 2537-2574.

Chen et al., "Highly sensitive biological and chemical sensors based on reversible fluorescence quenching in a conjugated polymer", PNAS, Oct. 1999, 96(22), 12287-12292.

Liu et al., "Effect of Chromophore-Charge Distance in the Energy Transfer Properties of Water-Soluble Conjugated Oligomers", J. Am. Chem. Soc., 2003, 125, 6705-6714.

Gaylord et al., "DNA detection using water-soluble conjugated polymers and peptide nucleic acid probes", PNAS, Aug. 2002, 99(17), 10954-10957.

Bronich et al., "Recognition of DNA Topology in Reactions between Plasmid Dna and Cationic Copolymers", J. Am. Chem. Soc., Sep. 2000, 122(35), 8339-8343.

Chen et al., "Tuning the Properties of Conjugated Polyelectrolytes through Surfactant Complexation", J. Am. Chem. Soc., 2000, 122, 9302-9303.

Gaylord et al., "Water-Soluble Conjugated Oligomers: Effect of Chain Length and Aggregation on Photoluminescene-Quenching Efficiencies", J. Am. Chem. Soc., 2001, 123, 6417-6418.

Hong et al., "Water-Soluble Oligmer Dimers Based on Paracyclophane: A New optical Platform for Fluorescent Sensor Applications", J. Am. Chem. Soc., 2002, 124, 11868-11869.

Gaylord et al., "DNA Hybridization Detection with Water-Soluble Conjugated Polymers and Chromophore-Labeled Single-Stranded DNA", J. Am. Chem. Soc., 2003, 125, 896-900.

Zhou et al., "Fluorescent Chemosensors Based on Energy Migration in Conjugated Polymers: The Molecular Wire Approach to Increased Sensitivity", J. Am. Chem. Soc., 1995, 117, 12593-12602.

Zhou et al., "Methodology for Enhancing the Sensitivity of Fluorescent Chemosensors: Energy Migration in Conjugated Polymers", J. Am. Chem. Soc., 1995, 117, 7017-7018.

Hawkins et al., "Incorporation of a fluorescent guanosine analog into oligonucleotides and its application to a real time assay for the HIV-1 integrase 3'-processing reaction", Nucleic Acids Research, 1995, 23(15), 2872-2880.

Cardullo et al., "Detection of Nucleic Acid Hybridization by Nonradiative Fluorescence Resonance Energy Transfer", Proc. Natl. Acad. Sci. USA, Dec. 1998, 85, 8790-8794.

Gallot et al., "Poly(L-lysine) containing azobenzene units in the side chains: influence of the degree of substitution on liquid crystalline structure and thermotropic behaviour", Liquid Crystals, 1997, 23(1), 137-146.

Wang et al., "Biosnesors from conjugated polyelectrolyte complexes", PNAS, Jan. 2002, 99(1), 49-53.

Liu et al., "Methods for strand-specific DNA detection with cationic conjugation polymers suitable for incorporation into DNA chips and microarrays", PNAS Early Edition, Dec. 2004, p. 1-5.

Vehse et al., "Light Amplification by Optical Excitation of a Chemical Defect in a Conjugated Polymer", Adv. Mater., Jun. 2004, 16(12), 1001-1004.

Liu et al., "Shape-Adapable Water-Soluble Conjugated Polymers", J. Am. Cham. Soc., 2003, 125, 13306-13307.

Liu et al., "Interpolyelectrolyte Complexes of Conjugated Copolymers and DNA: Platforms for Multicolor Biosensors", J. Am. Chem. Soc., 2004, 126, 1942-1943.

Huang et al., "High-Efficiency, Evironment-Friendly Electroluminescent Polymers with Stable High Work Function Metal as a Cathode: Green- and Yellow-Emitting Conjugated Polyfluorene Polyelectrolytes and Their Neutral Precursors", J. Am. Chem. Soc., 2004, 126, 9845-9853.

Service, "DNA Analysis: Microchip Arrays Put DNA on the Spot", The American Association for the Advancement of Science, Oct. 1998, 282(5388), 396-399.

Southern, "DNA chips: analysing sequence by hybridization to oligonucleotides on a large scale", TIG, Mar. 1996, 12(3), 110-115.

Epstein et al., "Microarray technology—enhanced versatility, persistent challenge", Current Opinion in Biotechnology, 2000, 11, 36-41.

Heeger et al., "Making Sense of polymer-based biosensors", PNAS, Oct. 1999, 96(22), 12219-12221.

Patel et al., "Energy transfer analysis of Fos-Jun dimerization and DNA binding", Proc. Natl. Sci. USA, Jul. 2994, 91, 7360-7364.

Lohse et al., "Fluorescein-Conjugated Lysine Monomers for Solid Phase Synthesis of Fluorescents Peptides and PNA Oligomers", Bioconjugate Chem., 1997, 8, 503-509.

Smith et al., "The synthesis of oligonucleotides containing an aliphatic amino group at the 5' terminus: synthesis of fluorescent DNA primers for use in DNA sequence analysis", Nucleic Acids Research, 1985, 13(7) 2399-2412.

Wintermeyer et al., "Fluorescent Derivatives of Yeast tRNA(TM)", Eur. J. Biochem., 1979, 98, 465-475.

Lipshutz et al., "High density synthetic oligonucleotide arrays", Nature Genetics Supplement, Jan. 1999, 21, 20-24.

Nilsson et al., "Chip solution detection of DNA hybridization using a luminescent zwitterionic polythiophene derivative", Nature Materials, Jun. 2003, 2, 419-424 (Supplementary Information pp. 1-2).

Dore et al., "Fluorescent Polymeric Transducer for the Rapid, Simple, and Specific Detection of Nucleic Acids at the Zeptomole Level", J. Am. Chem. Soc., 2004, 126, 4240-4244.

Ranade et al., "High-Throughput Genotyping with Single Nucleotide Polymorphisms", Genone Research, 2001, 11, 1262-1268.

Schork et al., "Single nucleotide polymorphisms and the furture if genetic epidemiology", Clin. Genet., 2000, 58, 250-264.

Wang et al., "Optically Amplified RNA-Protein Detection Methods Using Light-Harvesting Conjugated Polymers", Adv. Mater., Sep. 2003, 15(17), 1425-1428.

Liu et al., "Homogeneuos Fluorescents-Based DNA Detection with Water-Soluble Conjugated Polymers", Chem. Mater., 2004, 16, 4467-4476.

Wolcott, "Advances in Nucleic Acid-Based Detection Methods", Clinical Microbiology Reviews, Oct. 1992, 5(4), 370-386.

Umek et al., "Electronic Detection of Nucleic Acids, A Versatile Platform for Molecular Diagnostics", Journal of Molecular Diagnostics, May 2001, 3(2), 74-84.

Stevens et al., "Exciton dissociation mechanisms in the polymeric semiconductors poly(9,9-dioctylfluorene) and poly(9,9-dioctylfluorene-co-benzothiadiazole)", Physical Review B, Apr. 2001, 63, 1-18.

Wang, "Survey and Summary From DNA biosensors to gene chips", Nucleic Acids Research, 2000, 28(16), 3011-3016.

Beier et al., "Versatile derivatisation of solid support media for covalent bonding on DNA-microchips", Nucleic Acids Research, 1999, 27(9), 1970-1977.

Hongbin Wu et al. "Efficient electron injection from a bilayer cathode . . ." Adv. Mater. 2004, 16, No. 20, Oct. 18, p. 1826-1830.

Fei Huang et al. "High efficiency, environment-friendly electroluminescent . . . " J. Am. Chem. Soc. 2004, 126, pp. 9845-9853.

Hongbin Wu et al. "High-efficiency electron injection . . . " Organic Electronics 6 (2005), pp. 118-128.

Yong Cao et al. "Efficient electron injection . . ." Society for Informational Display International Symposium 2004, 35, Digest pp. 892-895.

U.S. Appl. No. 60/202,647, filed May 8, 2000, Whitten.
U.S. Appl. No. 60/226,902, filed Aug. 23, 2000, Whitten.
U.S. Appl. No. 60/230,186, filed Sep. 1, 2000, Philips.
U.S. Appl. No. 60/237,000, filed Sep. 29, 2000, Bruchez.
U.S. Appl. No. 60/240,216, filed Oct. 13, 2000, Bruchez.
U.S. Appl. No. 60/276,090, filed Mar. 16, 2001, Jones.
U.S. Appl. No. 60/314,094, filed Aug. 23, 2001, Burdick.
U.S. Appl. No. 60/314,101, filed Aug. 23, 2001, Whitten.

Cao et al. "Polymer Light-Emitting Diodes with Polyethylene Dioxythiophene-Polystyrene Sulfonate as the Transparent Anode" Synthetic Metals 87 (1997) 171-174.

* cited by examiner

PFO-ETM

PVK-SO₃Li

PFO-F (1%)

Ir(HFP)₃ t-Bu-PBD-SO₃Na

US 8,076,842 B2

MULTILAYER POLYMER LIGHT-EMITTING DIODES FOR SOLID STATE LIGHTING APPLICATIONS

CROSS-REFERENCE WITH RELATED APPLICATIONS

This present application is a continuation-in-part of application Ser. No. 10/680,084, filed on Oct 6, 2003 now U.S. Pat. No. 7,830,085.

FIELD OF THE INVENTION

This invention is in the field of organic polymer-based light-emitting diodes. More particularly this invention relates to multilayer polymer light-emitting diodes (PLEDs) that, in certain embodiments, emit white light that is useful for solid state lighting applications. This invention also pertains to methods for preparing these diodes.

BACKGROUND OF THE INVENTION

Polymer light-emitting diodes (PLEDs) which employ semiconducting polymers as emitting layers have been demonstrated. A wide range of colors of emission can be achieved by varying the materials present in the emitting layers. Blends of emitting polymers alone and together with organometallic emitters can be used to achieve additional color shades of emitted light including white light.

LEDs that emit white light are of interest and potential importance for use as back lights in active matrix displays (with color filters) and because they can be used for solid state lighting [A. J. Heeger, Solid State Commu., 1998. 107,673 & Rev. Modem Phys., 2001,73, 681; B. W. D'Andrade, S. R. Forrest, Adv. Mater., 2004, 16, 1585; R. H. Friend, R. W. Gymer, A. B. Holmes, J. H. Burroughes, R. N. Marks, C. Taliani, D. D. C. Bradley, D. A. Dos Santos, J. L. Bredas, M. J. Ögdlund, and. W. R. Salaneck, Nature, 1999, 397, 121]. In such applications, the fabrication of large-area devices and the use of low-cost manufacturing technology will be the major issues. The fabrication of PLEDs by processing the active materials from solution (e.g. by use of ink-jet printing or other printing technologies) promises to be less expensive than that of OLEDs (organic light-emitting diodes based on small molecules) where deposition of the active layers requires the use of vacuum technology [B. W. D'Andrade, S. R. Forrest, Adv. Mater., 2004, 16, 1585] Several approaches have been used to generate white light and light of other colors from OLEDs and PLEDs [J. Kido, H, Shionoya, K, Nagai, Appl. Phys. Lett., 1995, 67, 2281-2283; C. Zhang, A. J. Heeger, J. Appl. Phys., 1998, 84, 1579; Z. Shen, P. E. Burrows, V. Bulvić, S. R. Forrest, M. E. Thompson, Science, 1997, 276, 2009; Y. Hamada, T. Sano, H. Fujii, Y. Nishio, Jpn. J. Appl. Phys., 1996, 35, L1339; Y. Z. Wang, R. G. Sun, F. Meghdadi, G. Leising, A. J. Epstein, Appl. Phys. Lett., 1999, 74, 3613; M. Strukelj, R. H. Jordan, A. Dodabalapur, A.; J. Am. Chem. Soc., 1996, 118, 1213; B. W. D'Andrade, R. J. Holmes, and S. R. Forrest, Adv. Mater., 2004, 16, 624]. In the approaches in the articles listed above, the efficiency was modest and the lifetime was limited by that of the blue emitters [J. Kido, H, Shionoya, K, Nagai, Appl. Phys. Lett., 1995, 67, 2281; Y. Hamada, T. Sano, H. Fujii, Y. Nishio, Jpn. J. Appl. Phys., 1996, 35, L1339; Y. Z. Wang, R. G. Sun, F. Meghdadi, G. Leising, A. J. Epstein, Appl. Phys. Lett., 1999, 74, 3613; M. Strukelj, R. H. Jordan, A. Dodabalapur, A.; J. Am. Chem. Soc., 1996, 118, 1213; U. Scherf, E. J. W. List, Adv. Mater. 2002, 14, 477; S. Setayesh, D. Marsitzky, K. Müllen, Macromolecules, 2000, 33, 2016; X. Gong, P. Iyer, D. Moses, G. C. Bazan, A. J. Heeger, Adv. Func. Mater., 2003, 13, 325].

PLEDs fabricated with semiconducting polymers doped with organometallic emitters offer the additional promise of "plastic" electronics. Representative examples of such devices are described in U.S. application Ser. No. 10/680,084 filed Oct. 3, 2003. The emissive layers of PLEDs can be fabricated by casting polymers and blends from solution, thereby enabling relatively simple and low cost manufacturing processes [G. D. Müller, A. Falcou, N. Reckefuss, M. Roijhn, V. Wiederhimggg, P. Rudati, H. Frohne, O. Nuyken, H. Becker, K. Meerholz, Nature, 2003, 421, 829].

The fabrication techniques most favored for producing multilayer PLEDs include the use of sputtering and various vapor deposition methods to lay down inorganic layers such as high work function metal-metal oxide contacts (electrodes) and protective metallic overlayers. Solvent deposition methods such as spin-casting or printing successive layers from solution can be used to lay down organic polymer emissive layers as well as other layers in the devices. When multiple organic layers are present there can be problems with successive layers interacting. The solvent of a later layer can dissolve or disfigure (etch) a prior layer. It is often desirable to have each layer be smooth and coherent, thus this interaction can be destructive.

Light may be characterized by three quantities: the CIE (Commission Internationale de l'Eclairage) coordinates, the color temperature (CT) and the color rendering index (CRI). "Pure" white light has CIE coordinates of (0.333, 0.333), and is obtained by balancing the emission of the colors employed. For illumination applications, the CT needs to be equivalent to that of a blackbody source between 3000°K. and 7500°K. Average daylight has CT=6500°K., while a fluorescent lamp (warm white) has CT=3000°K. [R. W. G. Hunt, Measuring Color, 2nd Ed. Ellis Horwood, 1991]. The CRI is a numerical measure of how "true" colors look when viewed with the light source. CRI values range from 0 to 100, with 100 representing true color reproduction. Fluorescent lamps have CRI ratings between 60 and 99. Though a CIU value of at least 70 may be acceptable for certain applications, a preferred white light source will have a CRI of about 80 or higher. The demonstration of PLEDs which emit illumination quality white light with high brightness, high efficiency, suitable CT, high CRI and stable CIE coordinates is of importance to the future of solid state lighting.

STATEMENT OF THE INVENTION

We have now discovered an improvement in multilayer PLEDs that enhances their efficiency and facilitates their fabrication.

We have found that the addition of an electron transport layer and/or a hole transport layer adjacent to the emissive layer of a PLED improves the PLED's performance. We have further found that these additional layers can be incorporated into PLEDs by solvent processing techniques if the materials employed in these additional layers are differentially soluble in solvents which differ in polarity from the solvents used to dissolve and solvent process the emissive layer.

Thus, this invention can provide multilayer polymer light-emitting diodes (PLEDs) that in certain embodiment emit white light and are useful for solid state lighting applications. More specifically, the present invention can provide multilayer white PLEDs comprising semiconducting polymers blended with organometallic emitters as a relatively nonpolar solvent-soluble emissive layer, and relatively polar solvent-soluble organic materials (polymers or small molecules) as a hole injection/transport layer (HIL/HTL) and/or as an electron injection/transport layer (EIL/ETL); all layers preferably being cast from the corresponding solutions. The white emission of these preferred materials of the present invention can be used for backlights in liquid crystal displays (LCDs) and for solid state lighting applications. The white light is emitted from the polymer blend in a single emissive layer. The strategy developed in this invention enables the fabrication of multilayer white emitting PLEDs by casting the emissive polymer blends, HIL/HTL, and EIL/ETL from the corresponding solutions. This invention also enables the relatively simple fabrication of multilayer PLEDs which emit illumination quality light in all colors from blue to red and including white light. The methodology presented in this invention enables the relatively simple fabrication of multilayer PLEDs which emit illumination quality white light with high brightness, high efficiency, suitable color temperature, high color rendering index, and stable CIE (Commission Internationale de l'Eclairage) coordinates. The method for fabrication of multilayer PLEDs presented in this invention can be used for large-area multilayer displays and other large-area multilayer opto-electronic devices fabricated by casting the various layers from solution.

The devices of the present invention employ an emissive layer and at least one of a hole injection/transport layer (HIL/HTL) and an electron injection/transport layer (EIL/ETL) adjacent to the emissive layer. The benefits of the transport layers can be observed in devices which employ a single layer hole injection anode, in which case the hole transport layer may at times be referred to as a "hole injection/transport layer" or "HIL/HTL." and also in devices which employ a bilayer anode with the second layer of the bilayer itself being a "hole injection layer." In this second case, to avoid confusion, the transport layer is referred to simply as a "hole transport layer" or "HTL" and the art-known "hole injection layer" or "HIL" retains its usual name. The devices of the present invention employ relatively nonpolar solvent-soluble semiconducting polymers blended with organometallic emitters as their emissive layers and polar solvent (for example water and/or lower alkanol)-soluble polymers and small molecules as both HIL/HTL and EIL/ETL layers. The devices of the present invention can employ two or three luminescent emitters (represented in the Examples as Type I and Type II devices), in a single emissive region, rather than red, green and blue emission in different regions that appear white when averaged by the observer. More than three emitters can be used as well. The luminescent emitters can emit white light via fluorescence (from singlet states) or a combination of fluorescence (from singlet states) and phosphorescence (from triplet states). White light can be achieved from two or three luminescent emitters blended into a single material that forms a single emissive thin film layer through the combined emission from the host polymer (such as a conjugated polymer) and from the additional emitters such as green and red-emitting components blended into the host polymer. A single emissive layer comprising two or three or more emissive centers allows the fabrication of emitting PLEDs and especially white light-emitting PLEDs by solution processing.

The HIL/HTL and/or EIL/ETL layers provide a means to balance the electron and hole currents and increase the efficiency of the devices. Importantly, using polar solvent-soluble materials as both the HTL and ETL and less polar solvent-soluble materials as the emissive layer allows the fabrication of multilayer PLEDs that emit light with different colors within the visible spectrum, from blue to red and especially white by processing the various layers from solution. The strategy of the present invention enables the relatively simple fabrication of bright and efficient multilayer PLEDs, including white-emitting PLEDs that are characterized by a high color rendering index, suitable color temperature and desired CIE coordinates. Moreover, the color rendering index, color temperature and CIE coordinates from these multilayer electrophosphorescent PLEDs are insensitive to brightness, insensitive to the applied voltage and insensitive to the current density. Furthermore, the method for fabrication of multilayer PLEDs presented in this invention can be used for development of large-area displays comprising multilayer light-emitting diodes and other large-area multilayer opto-electronic devices processed from solution by printing technology.

One object of the present invention is to provide a method to produce multilayer PLEDs and especially white light-emitting PLEDs that exhibit high luminous efficiency, high external quantum efficiency and brightness adequate for applications in solid state lighting and as backlights for liquid crystal displays (LCDs).

Another object of the present invention is to produce high-performance multilayer PLEDs by using polar solvent-soluble polymers and small molecules as a hole injection/transporting layer and/or as an electron injection/transporting layer.

A third object of the present invention is to provide a technology which can be used for development of multilayer displays comprising light-emitting diodes and other multilayer opto-electronic devices processed from solution by printing technology.

Yet another object of the present invention is to produce multilayer white PLEDs that exhibit white light with high color rendering index, suitable color temperature and desired CIE coordinates.

A further object of the present invention is to utilize polar solvent-soluble polymers and small molecules as hole injection/transport layers and/or as electron injection/transport layers in PLEDs.

An additional object of the present invention is to produce multilayer white emitting PLEDs with stable color rendering index, stable color temperature and stable CIE coordinate all of which are insensitive to brightness, applied voltage and current density.

Yet another object of the present invention is to produce multilayer white light-emitting PLEDs that produce white emissions having CIE x, y-chromaticity coordinates close to the CIE coordinates of pure white light (0.333, 0.333).

An additional object of the present invention is to produce multilayer white light-emitting PLEDs that produce white emissions having color temperature close to the 6400°K. value characteristic of average daylight or close to the 4500°K. value characteristic of sunlight at solar altitude 20°.

A further object of the present invention is to produce multilayer white light-emitting PLEDs that produce white emission having color rendering indices in excess of 80.

Yet another object of the present invention is to produce multilayer white light-emitting PLEDs that produce white emission having color rendering indices in excess of 90.

DETAILED DESCRIPTION OF THE INVENTION

Brief Description of the Drawings

This invention will be further described with reference being made to the drawings in which.

Figure 2:
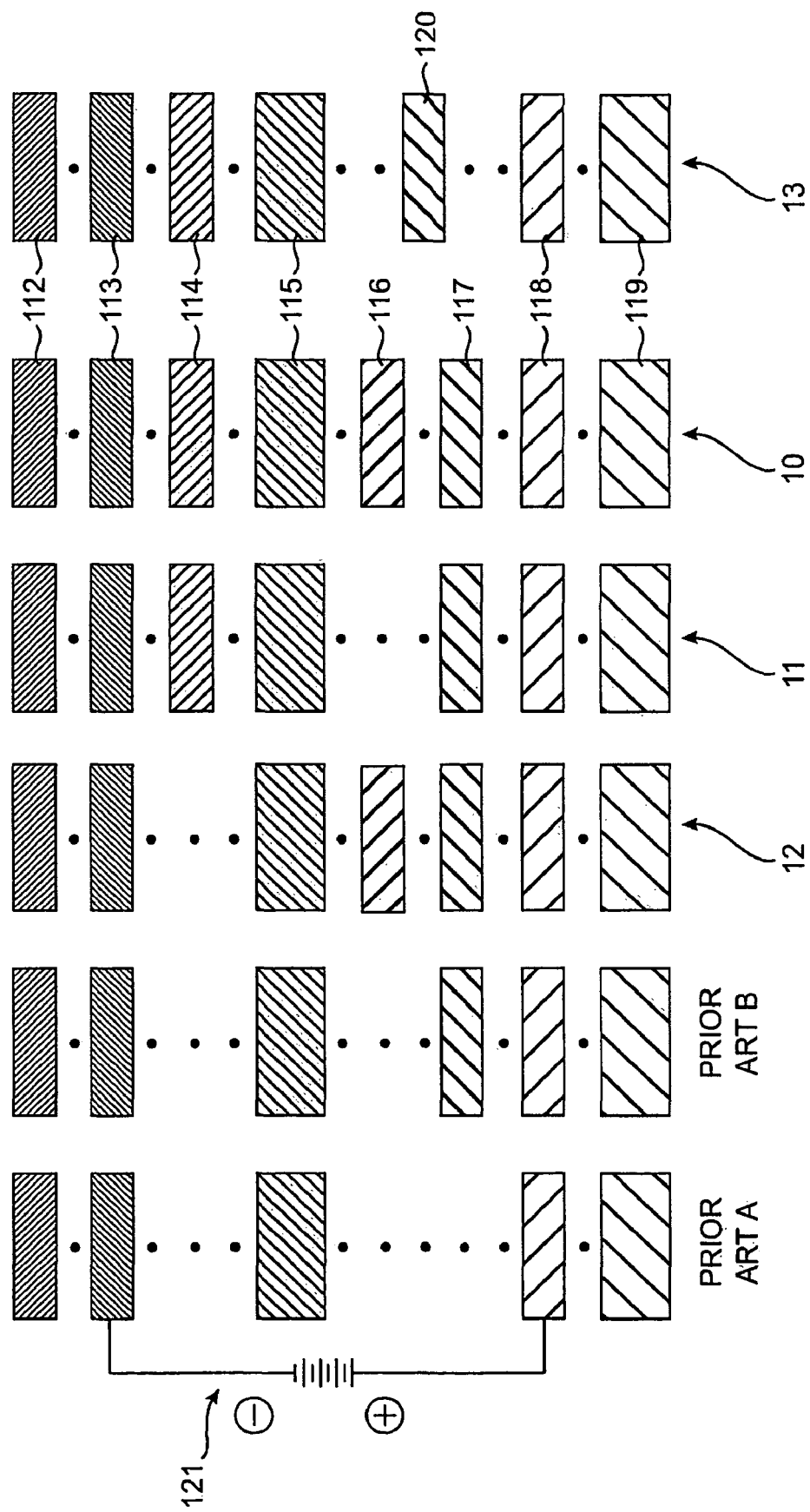
Figure 3:
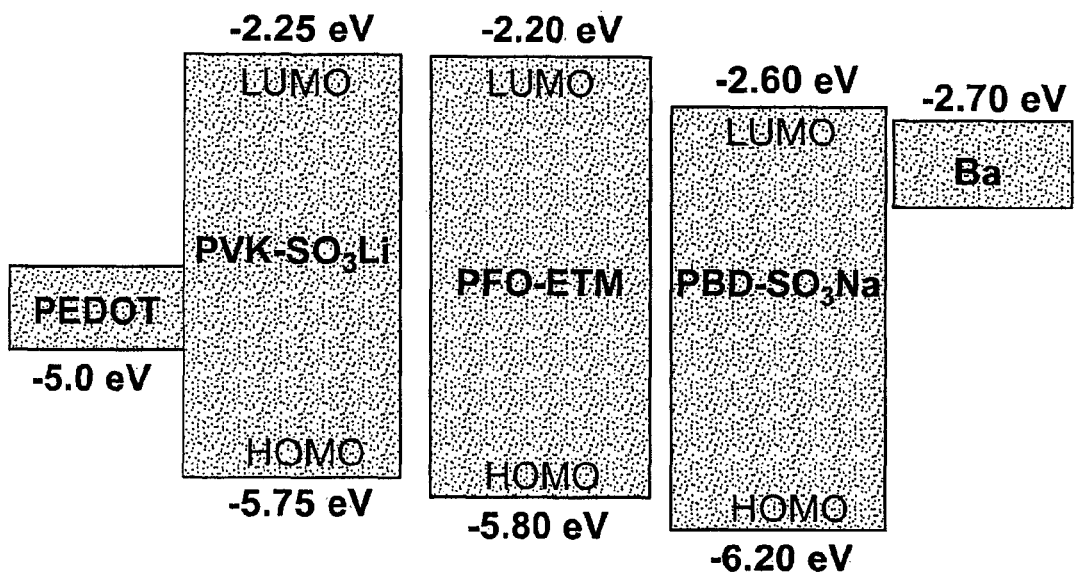
Figure 4:
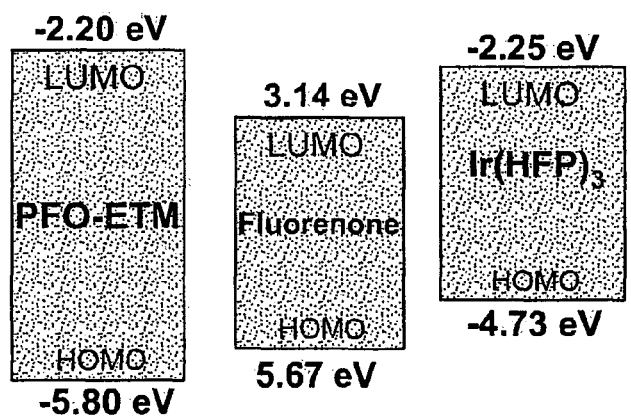
Figure 5:
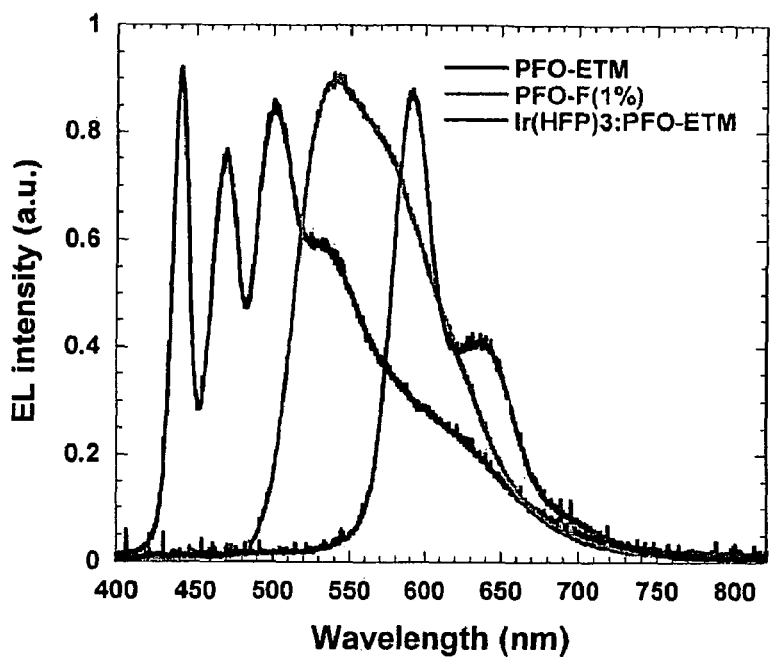
Figure 6:
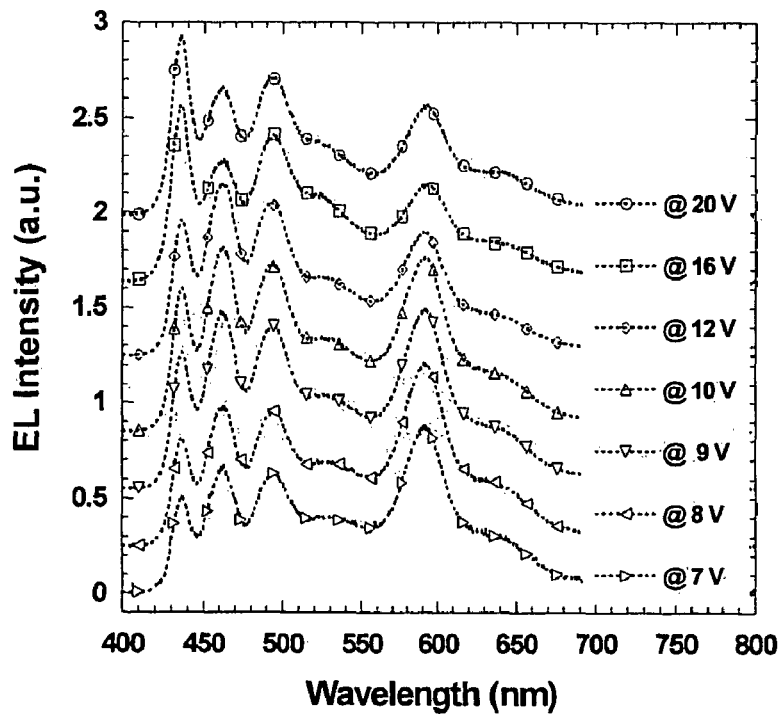
Figure 7:
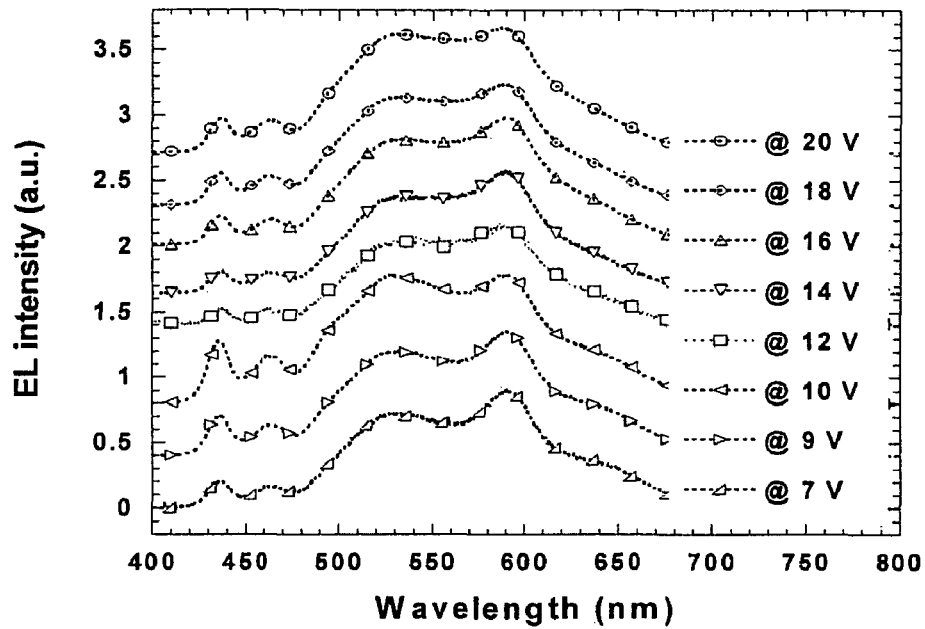
Figure 8:
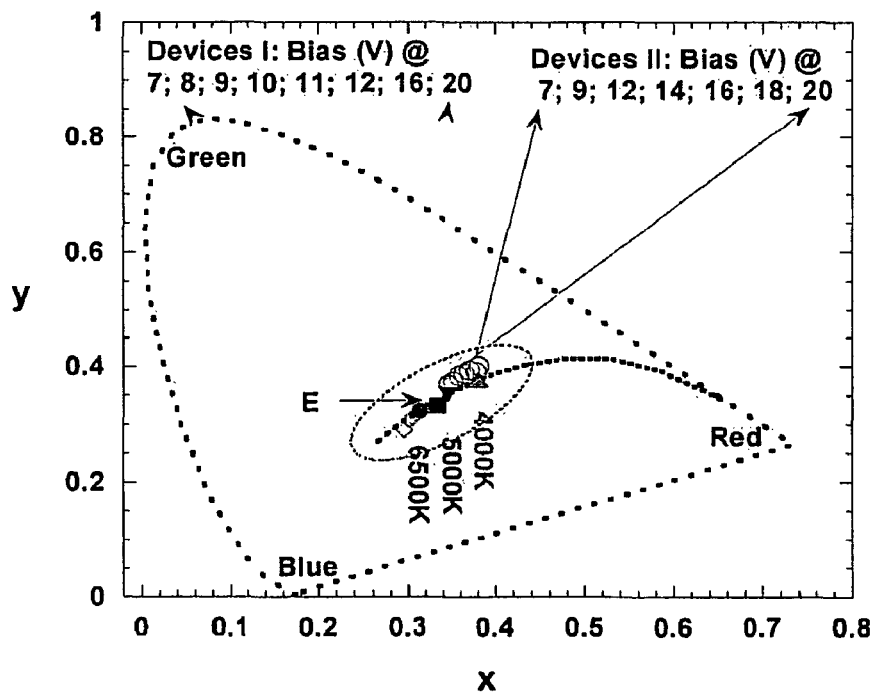
Figure 9:
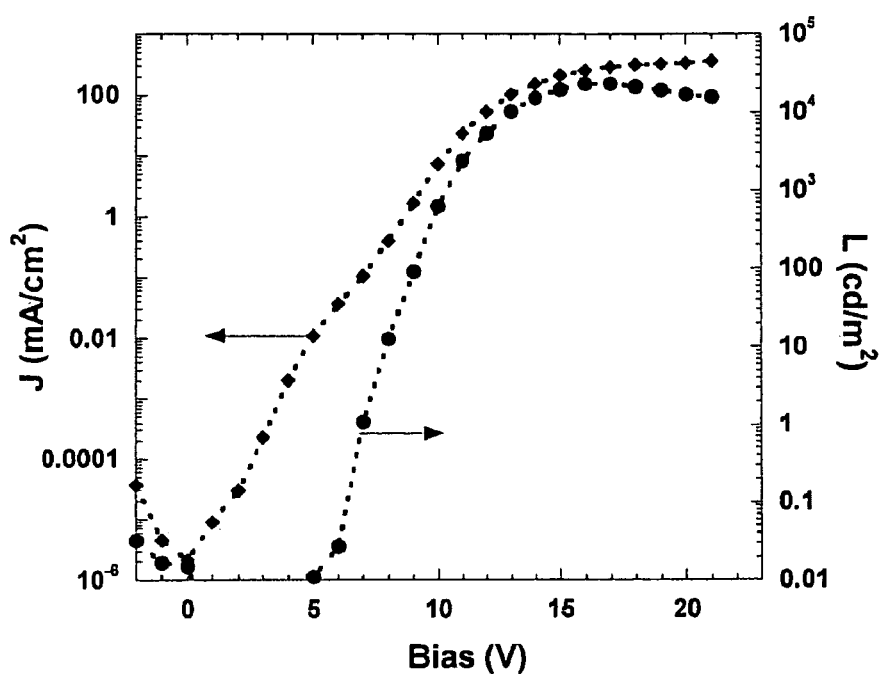
Figure 10:
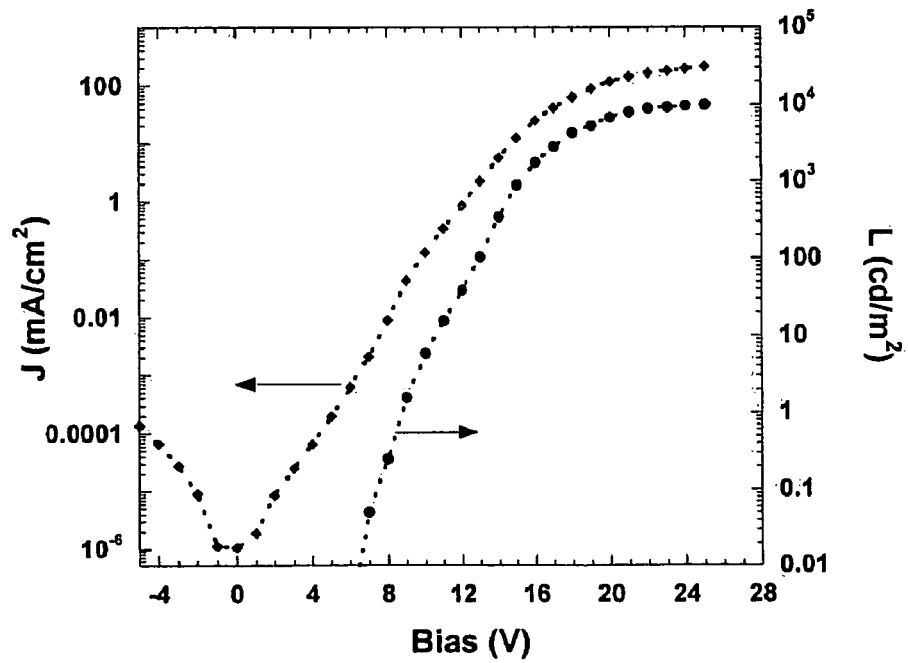
Figure 11:
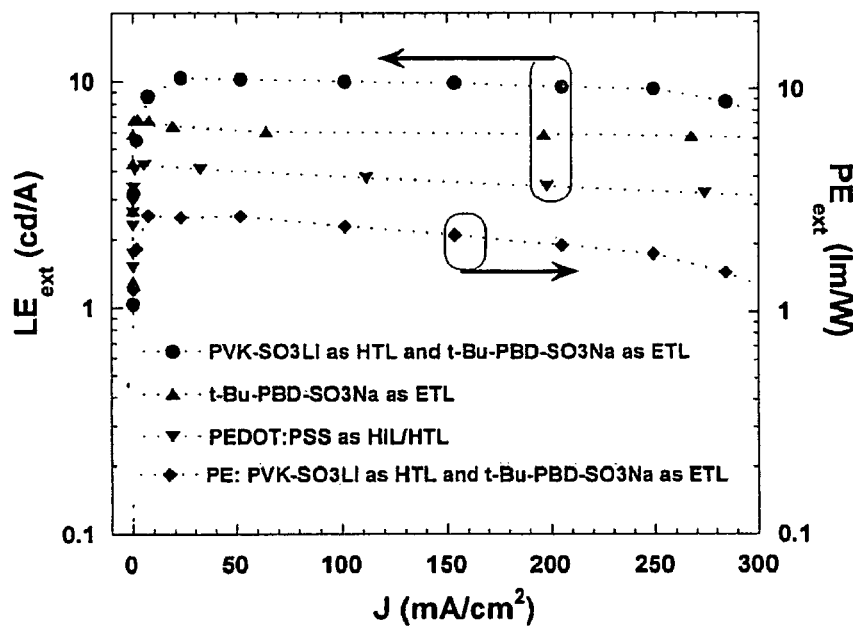
Figure 12:
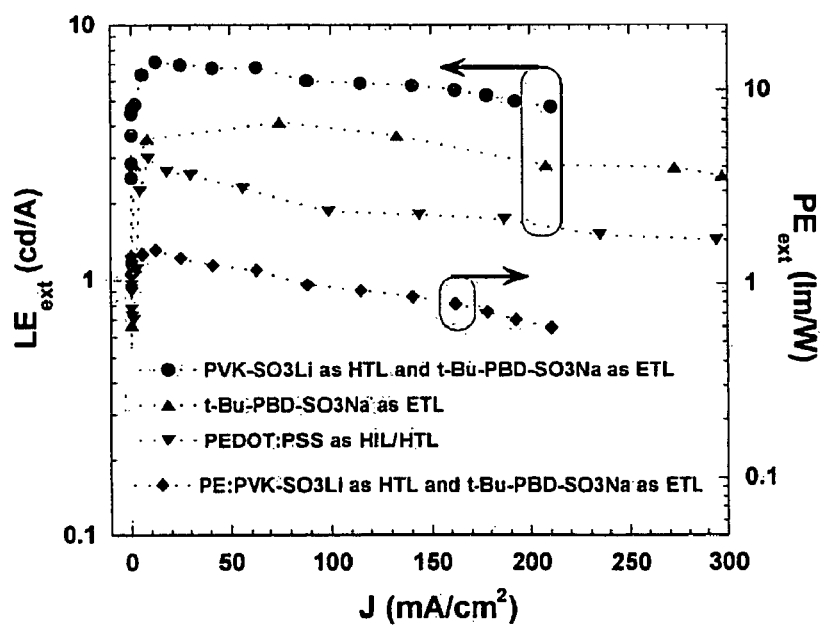
Figure 13:
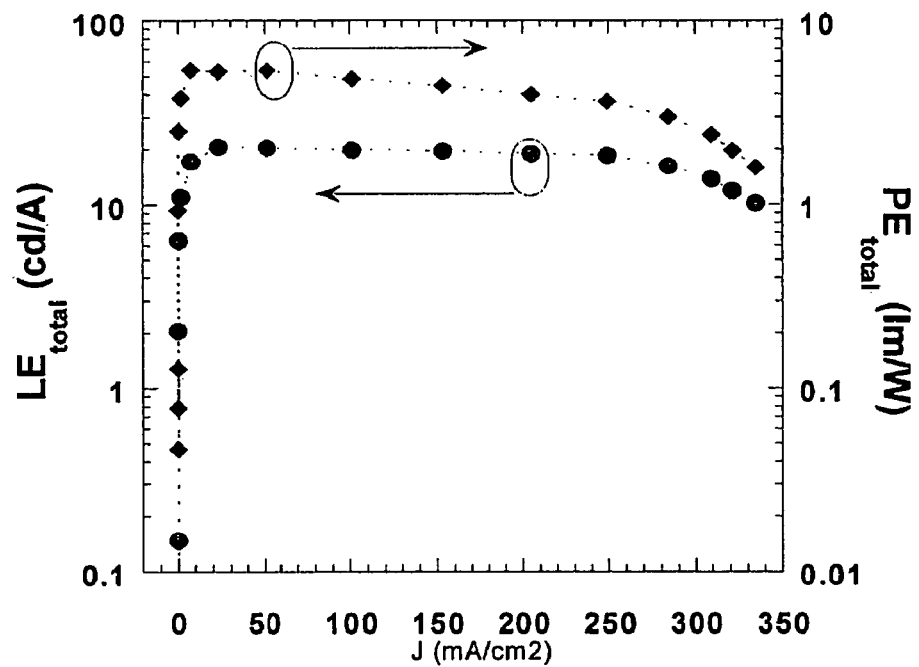
Figure 14:
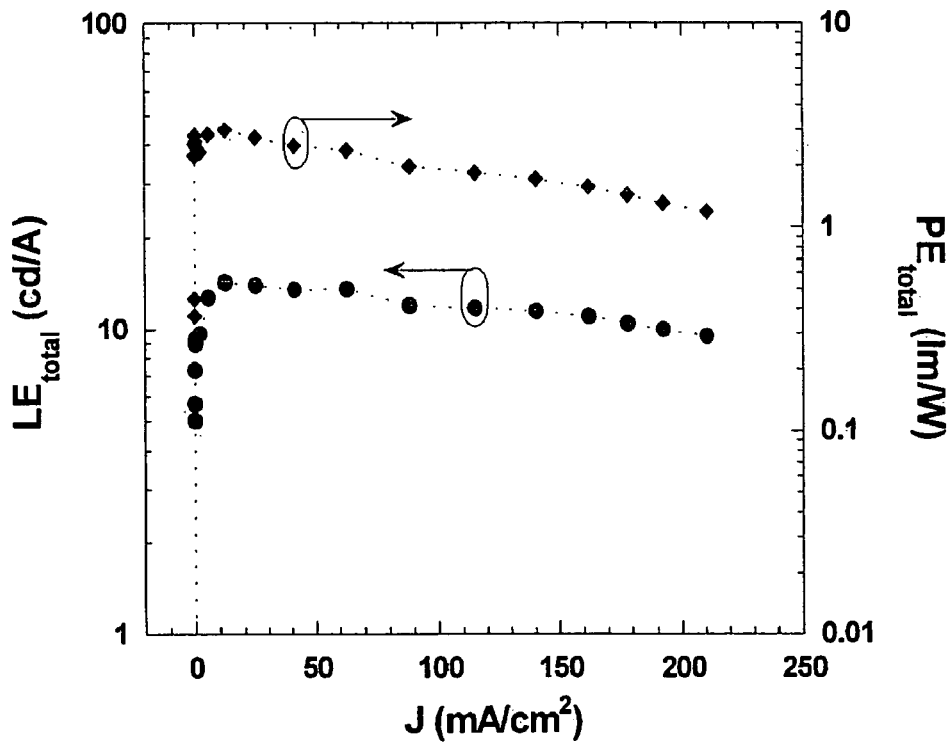

FIG. 2 shows several representative device configurations in schematic cross-section;

FIG. 3 shows the highest occupied molecular orbital (HOMO) and the lowest unoccupied molecular orbital (LUMO) energy levels of PFO-ETM, PVK-S03Li, t-Bu-PBD-S03Na and the work functions of PEDOT:PSS and Ba;

FIG. 4 shows the HOMO and LUMO energy levels of PFO-ETM, PFO-F (1%) and Ir (HFP)$_3$;

FIG. 5 shows the electroluminescent spectra of the devices made with pure PFO-ETM, PFO-F (1%) and Ir(HFP)$_3$ doped into PFO-ETM (Ir(HFP)$_3$:PFO-ETM=1 wt.-%), as emissive layers;

FIG. 6 shows the electroluminescent spectra obtained from Type I electrophosphorescent PLEDs at different applied voltages;

FIG. 7 shows the electroluminescent spectra obtained from Type II electrophosphorescent PLEDs at different applied voltages;

FIG. 8 shows the CIE (193 1) chromaticity diagram, with coordinates corresponding to the emission from Type I devices (□□□) and Type II devices (ooo) biased at different applied voltages. Also shown are the equi-energy point (E) for pure white light (0.333, 0.333) (■) and the coordinates corresponding to color temperatures of 4000°K.(▲), 5000°K.(▼) and 6500°K.(●). The dotted line indicates different color temperatures; the dotted oval indicates the approximate area where the human eye perceives the color as white;

FIG. 9 shows the luminance versus applied voltage and current density versus applied voltage for Type I devices;

FIG. 10 shows the luminance versus applied voltage and current density versus applied voltage for Type II devices;

FIG. 11 shows the forward viewing external luminous efficiency (LE$_{ext}$) versus current density, J (mA/cm$^2$) for devices with poly(3,4-ethylenedioxythophene):styrene sulfonic acid PEDOT:PSS as the HIL/HTL and t-Bu-PBD-SO$_3$Na as the ETL, and for devices with PVK-SO$_3$Li as the HTL and t-Bu-PBD-SO$_3$Na as the ETL, respectively; and the forward viewing external power efficiency (PE$_{ext}$, 1 m/W) versus J (mA/cm$^2$) for Type I devices;

FIG. 12 shows the forward viewing external luminous efficiency (LE$_{ext}$) versus current density, J (mA/cm$^2$) for the devices with PEDOT:PSS as the HIL/HTL and t-Bu-PBD-SO$_3$Na as the EIL/ETL, and for devices with PVK-SO$_3$Li as the HIL/HTL and t-Bu-PBD-SO$_3$Na as the EIL/ETL, respectively; and the forward viewing external power efficiency (PE$_{ext}$, 1 m/W) versus J (mA/cm$^2$) for Type II devices;

FIG. 13 shows the total external luminous efficiency (LE$_{total}$) and the total external power efficiency (PE$_{total}$, 1 m/W) versus current density, J (mA/cm$^2$) for Type I devices with PEDOT:PSS as the HIL, PVK-SO$_3$ as the HTL and t-Bu-PBD-SO$_3$Na as the EIL/ETL; and FIG. 14 shows the total external luminous efficiency (LE$_{total}$) and the total external power efficiency (PE$_{total}$, 1 m/W) versus current density, J (mA/cm$^2$) for Type II devices with PEDOT:PSS as the HIL and PVK-SO$_3$Li as the HTL and t-Bu-PBD-SO$_3$Na as the EIL/ETL.

DESCRIPTION OF PREFERRED EMBODIMENTS

Nomenclature and Abbreviations

Figure 1:
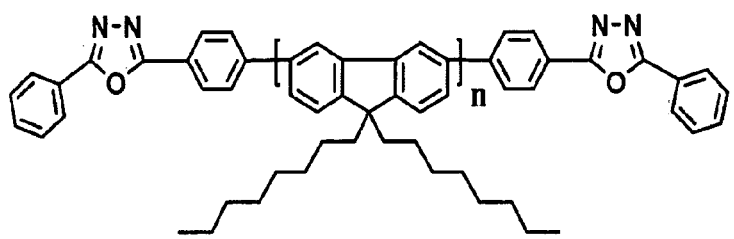
FIG. 1 shows the molecular structures of representative materials employed in the fabrication of devices of this invention including: poly(9,9-dioctylfluorene) (FFO); poly(9,9- dioctylfluorene) end-capped with 5-biphenyl-1,3,4-oxadiazole (PFO-ETM) (the electron-transport-moiety); poly(9,9-dioctylfluorene-co-fluorenone) with 1% fluorenone (PFO-F (1%)); tris (2,5-bis-2'-(9',9'-dihexylfluorene) pyridine) iridium (III), Ir(HFP)$_3$; poly(vinylcarbazole) sulfonic lithium (PVK-SO$_3$Li); and 4-(5-(4-tert-butylphenyl)-1,3,4-oxadiazole-2-yl)-biphenyl-4'-yl sulfonic sodium (t-Bu-PBD-S0$_3$Na)
Figure 1:
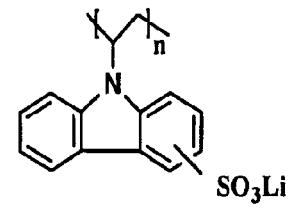
Figure 1:
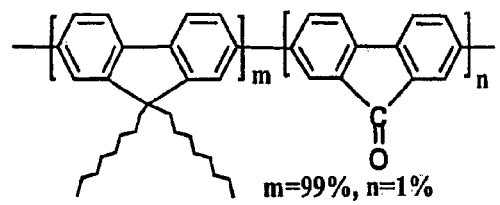
Figure 1:
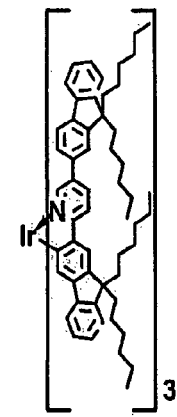
Figure 1:
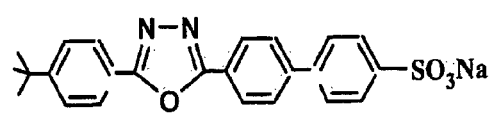

In this description of this invention a variety of chemical compounds will be referred to. Some of the compounds being named are depicted in FIG. 1.

In addition, the following abbreviations will be employed.
CIE Commission Internationale de l'Eclairage
CT color-rendering index
EIL/ETL electron injection-transport layer
ETM electron-transport layer
HIL/HTL hole injection-transport layer
HIL hole injection layer
HTL hole transport later
HFP 9,9-dihexylfluorene pyridine
HOMO highest occupied molecular orbital
ITO indium tin oxide
Ir(HFP)$_3$ tris 2,5-bis-2'(9',9' dihexylfluorene) pyridine iridium (III)
LCD liquid crystal display
LUMO lowest unoccupied molecular orbital
MEH-PPV poly[2-methoxy-5-(2-ethyl-hexyloxy)-1,4-phenylenevinylene
MBL-PPV poly[5-methoxy-2-(4-sulfobutoxy)-1,4-phenylenevinylene
OLED organic-light-emitting diode
PLED polymer light emitting diode
PPV poly(phenylenevinylene)
PFO poly(9,9-dioctylfluorene)
PFO-ETM poly(9,9-dioctylfluorene) endcapped with electro-transport-moiety for example, poly(9,9-dioctylfluorene) endcapped with 5-biphenyl-1,3,4 oxadiazole
PFO-F poly(9,9-dioctyfluorene)-fluorenone
t-Bu PBD-SO$_3$Na 4-(5-(4-tert-butylphenyl)-1,3,4-oxasiazole-2-yl)biphenyl-4'-yl sulfonic sodium
PVK poly(vinylcarbazole)
PVK-SO$_3$Na poly(vinylcarbazole) sulfonic sodium
PVK-SO$_3$Li poly(vinylcarbazole) sulfonic lithium
PEDOT: SSS poly(3,4-ethylenedioxythophene): styrene sulfonic acid
poly(BT[PD-Si-PFCB) poly(bis)tetraphenyldiamino)biphenyl-perfluorocyclobutane
THF tetrahydrofuran
DMSO dimethyl sulfoxide
DMF dimethylformamide Definitions In this description of this invention and in the claims, at times reference is made to solvents as being "polar" or "nonpolar" and reference is made to a material being "differentially soluble" or having "differential solubility" in "polar" or "nonpolar" solvents.

Solvent polarity is defined herein in accord with the teachings of Christian Reichart, Solvents and Solvent Effects in Organic Chemistry, VCH Publishers 2nd ed., 1988. Reichart provides values for relative polarity ranging from a high of 1.000 for water to a low of 0.006 for cyclohexane. Using these relative polarity values, a "polar solvent" is defined to be a solvent having a relative polarity of from 0.400 to 1.000. Such solvents include, for example, water, glycerin, ethylene glycol, methanol, diethylene glycol, ethanol; the propanols, acetonitrile, dimethyl sulfoxide (DMSO) and dimethylformamide (DMF) and mixtures thereof. Water, lower alkanols (C1-C3) and mixtures thereof are preferred polar solvents.

A "nonpolar solvent" is defined to be a solvent having a relative polarity of from 0.006 to about 0.300. Such solvents include, for example, cyclohexane, pentane, hexane, heptane;

carbon tetrachloride, xylene toluene, benzene, diethyl ether, methyl-tert-butyl-ether (MTBE), dioxane, tetrahydrofuran (THF), ethyl acetate, glyme, diglyme and chloroform. C6-C8 hydrocarbons and especially benzene and toluene are preferred nonpolar solvents.

In the processing of this invention various materials are said to be "differentially soluble" in a "polar" solvent or a "nonpolar" solvent. This means, at its most general, that the material is more soluble in one family of solvents than the other. Preferably "differential solubility" implies in that a material is at least 150% and more preferably at least 200% and most preferably at least 300% as soluble in one family as in the other.

Device Configurations

As shown as "A" in FIG. 2, PLEDs of the prior art have been made up of a semiconducting luminescent emitter layer 115 contacted with a low work function electron injection electrode 113 and a high work function hole injection electrode 118. As shown in "A," PLEDs are supported on a substrate 119 which provides mechanical strength and commonly contain a passivation layer 112 to mechanically and chemically protect the electrode on the side away from the support. The positions of support 119 and passivation layer 112, relative to the hole injection electrode 118 and electron injection electrode 113 are most commonly as depicted in FIG. 2. One could reverse these positions if desired and put the electron injection electrode on the support without departing from the spirit of the invention. Similarly, in describing the invention and its advantages, at times references to these "support 119" and "protective outer layer 112" layers may be omitted for simplicity.

As also shown in FIG. 2 at "B," the prior art further contemplated PLEDs which included a bilayer anode made up of an organic hole injection layer 117 located between the hole injection electrode 118 and the emissive layer 115. This bilayer anode hole injection configuration is known [D. Braun and A. Heeger, Appln. Phys. Lett., 119, 58, 1982].

FIG. 2, at 10, 11 and 12, depicts three configurations for devices of this invention in which one or two additional "transport" layers 114 and 116 are present. When two "transport" layers are present they are on opposite sides of the emissive layer 115 (see 10). When one "transport" layer is present it can be on the electron injection side of layer 115 as EIL/ETL 114 (see 11) or on the hole injection side of layer 115 as HTL 116 (see 12). We have obtained best results when both of EIL/ETL and HTL are present.

It should be kept in mind that the bilayer anode hole injection electrode of prior art B in FIG. 2 includes an organic hole injection layer 117. In embodiment 13, hole injection layer is combined with the hole transport layer as a single HIL/HTL organic layer 120.

These individual layers will next be described.

The Emissive Layer (115)

The emissive layer 115 shown in FIG. 2 comprises a blend (mixture) of one or more emitting polymers (or copolymers) with one or more organometallic emitters. Preferred emitting polymers are generally conjugated. Preferred examples include devices made from PFO or poly(9,9-dioctylfluorene) end-capped with 5-biphenyl-1,3,4-oxadiazol (PFO-ETM) blended with tris (2,5-bis-2'-(9',9'-dihexylfluorene)pyridine) iridium (III), (Ir(HFP)$_3$) and devices made from blends of PFO-ETM with poly(9,9-dioctylfluorene-co-fluorenone) with 1% fluorenone (PFO-F(1%)) and Ir(HFP)$_3$. FIG. 1 shows the molecular structures of PFO-ETM, PFO-F(1%) and Ir(HFP)$_3$. The synthesis of PFO-ETM has been reported in the scientific literature (X. Gong, W. L. Ma, J. C. Ostrowski, K. Bechgaad, G. C. Bazan, D. Moses, A. J. Heeger, S. Xiao, Adv. Func. Mater., 2004, 14,393]. Other emitting polymers and especially blue-emitting polymers can also be used in the practice of the invention. The synthesis of Ir(HFP)$_3$ has been reported in the scientific literature [J. C. Ostrowski, M. R. Robinson, A. J. Heeger and G. C. Bazan, Chem. Commun., 2002, 7, 784]. The synthesis of PFO-F(1%) was also reported [X. Gong, D. Moses and A. J. Heeger, Synth. Met. 2004, 141, 17]. Ir(HFP)$_3$ is representative of the useful organometallic emitters which are complexes and compounds having Ir, Pr, Os, Ru or Au or the like as a center atom.

High-performance PLEDs based on PFO-ETM as host and organometallic emitters as guests have been previously demonstrated. [X. Gong, W. L. Ma, J. C. Ostrowski, K. Bechgaad, G. C. Bazan, D. Moses, A. J. Heeger, S. Xiao, Adv. Func. Mater., 2004, 14, 393; X. Gong, J. C. Ostrowski, D. Moses, G. C. Bazan, A. J. Heeger, M. S. Liu, A. K-Y. Jen, Adv. Mat. 2003,15,45; X. Gong, J. C. Ostrowski, D. Moses, G. C. Bazan, A. J. Heeger, J. Poly. Sci. Poly. Phys., 2003, 41, 2691].

The polymer materials used in these emissive layers commonly show differential solubility in nonpolar solvents, such as hydrocarbon solvents.

The materials described herein as preferred are preferred in settings where white light emission is desired. The polymers such as PFO-ETM themselves are blue-emitting materials. The organometallic emitter and the other host polymers can produce emissions which result in a white overall emission.

The Electron Injection/Transport Layer (114)

The electron injection/transport layer (EIL/ETL), typically 20 to 30 nm thick, is cast from solution onto the top surface of emissive layer 115 as shown in FIG. 2. The electron injection/transport layer is fabricated from a semiconducting organic polymer material with a relatively large electron affinity; i.e. with a lowest unoccupied molecular orbital (LUMO) close in energy to that of the bottom of the π*-band of the luminescent polymer in the emissive layer, for example within about 1 eV. Preferably the EIL/ETL is fabricated from a material having a LUMO closer to the LUMO of the emissive layer than the work function of the low work function electron injection electrode. Examples include t-Bu-PBD SO$_3$Na [T. J. Boyd, R. R. Schrock, Macromolecules, 1999, 32, 6608]. This layer is cast from a polar solvent-based solution such as an aqueous and/or lower alkanol solution.

The Hole Transport Layer (116)

The hole transport layer (HTL), typically 20 to 30 nm thick, is cast from solution onto the top surface of hole injection layer 117. If the hole injection electrode is a single layer anode 118 which does not have a layer 117, then the layer 116 will be deposited directly in electrode 118 as an HIL/HTL as will explained. The hole injection/transport layer is fabricated from a semiconducting organic polymer material with a relatively small ionization potential; i.e., with highest occupied molecular orbital (HOMO) close in energy to that of the top of the n-band of the luminescent polymer in the emissive layer, for example within about 1 eV. Preferably the HTL is fabricated from a material having a HOMO closer to the HOMO of the emissive layer than the work function of the hole injection electrode. Examples include PVK-S03Li [S. Wang, Z. Zeng, S. Yang, L.-T. Weng, P. C. L. Wong, K. Ho, Macromolecules, 2000, 33, 3232. This layer is cast from a polar solvent-based solution such as an aqueous and/or lower alkanol solution.

The devices of the invention may include a bilayer anode. One layer of a bilayer anode is generally referred to as a "Hole Injection Layer" or "HIL." If such a layer is present, then this layer 116 will be referred to as a "Hole Transport Layer" or "HTL." If a separate Hole Injection Layer is not present then layer 116 can serve both functions and can be referred to as a "Hole Injection Transport Layer" or "HIL/HTL."

The Optional Hole Injection Layer (117)

When a hole injection layer 117 is present to provide a bilayer anode, it is typically 20 to 30 nm thick and is cast from solution onto the electrode 118. Examples of materials used in layer 117 include semiconducting organic polymers such as PEDOT:PSS cast from a polar (aqueous) solution or the precursor of poly(BTPD-Si-PFCB) [S. Liu, X. Z. Jiang, H. Ma, M. S. Liu, A. K.-Y. Jen, Macro., 2000, 33, 3514; X. Gong, D. Moses, A. J. Heeger, S. Liu and A. K.-Y. Jen, Appl. Phys. Lett., 2003, 83, 183]. PEDOT:PSS is preferred. On the other hand, by using poly(BTPD-Si-PFCB) as hole injection layer, many processing issues existing in PLEDs, brought about by the use of PEDOT:PSS, such as the undesirable etching of emissive polymers, undesirable etching of ITO electrodes, and the formation of micro-shorts can be avoided [G. Greczynski, Th. Kugler and W. R. Salaneck, Thin Solid Films, 1999, 354, 129; M. P. de Jong, L. J. van Ijzendoorn, M. J. A. de Voigt, Appl. Phys. Lett. 2000, 77, 2255].

It will be noted that the advantages of using an emissive layer made of polymers differentially soluble in nonpolar solvents with transfer layers made of materials differentially soluble in polar solvents also are achieved when the optional hole injection layer is made of materials differentially soluble in polar solvents. This means that in embodiment 13 of FIG. 2 where a single hole injection/transport layer 120 is employed, it is advantageously differentially soluble in a polar solvent to achieve the desired processing advantages. The materials in this layer 120 can essentially duplicate the materials in layer 117 and layer 116, if desired.

The High Work Function Electrode (118)

The high work function hole injection electrode is typically a transparent conductive metal-metal oxide or sulfide material such as indium-tin oxide (ITO) with resistivity of 20 ohm/square or less and transmission of 89% or greater @ 550 nm. Other materials are available such as thin, transparent layers of gold or silver. A "high work function" in this context is generally considered to be a work function of about 4.5 eV or greater. This electrode is commonly deposited on the solid support 112 by thermal vapor deposition, electron beam evaporation, RF or Magnetron sputtering, chemical deposition or the like. These same processes can be used to deposit the low work-function electrode 113 as well. The principal requirement of the high work function electrode is the combination of a suitable work function, low resistivity and high transparency.

The Low Work Function Electrode (113)

The low work function electrode 113 serves as an electron injection contact. It is typically made of a low work function metal or alloy placed on the opposite side of the active emissive polymeric layer 115 from electrode 118. Low work function metals in the context of the present invention include materials with a work function of about 4.3 eV or less and are known in the art to include, for example Ba, Ca, Mg, In and Th. They are often accompanied by a layer of stable metal such as Ag, Au, Al or the like. This serves as a protection layer on top of reactive materials such as Ba, Ca, Tb. Other low work function (low ionization potential) conducting materials can be used in place of a conventional metal as the electron injection contact. The thickness of the electron injection electrode film is not critical and can be adjusted to achieve the desired surface resistance (surface resistance or sheet resistance is defined as the resistivity divided by the thickness) and can typically vary in the range of from significantly less than 100 Å to about 2000 Å or more. These materials are generally laid down as thin films with the techniques set out in the description of electrode 118.

The Support (119)

The various active layers 113-118 and passivation layer 112 are usually supported by a solid substrate 119. This can be a rigid material such as plastic, glass, silicon, ceramic or the like or a flexible material such as a flexible plastic as well. This support may be transparent (as is the support shown in FIG. 2) in which case the light can be emitted through it and through the transparent electrode 118. Alternatively, the support can be non-transparent, in which case the transparent electrode 118, through which light is emitted, is on the surface of the emissive layer away from the support.

The Passivation Layer (112)

The passivation (protection) layer on the cathode is commonly made up of a stable metal that is typically thermally deposited in vacuum onto the top surface of the low work function metal cathode. Useful metals for the passivation layer are known in the art and include, for example, Ag and Al and the like. The thickness of the passivation layer is not critical and can be adjusted to achieve the desired surface resistance (surface resistance or sheet resistance is defined as the resistivity divided by the thickness) and can vary in the range of from few hundred Angstroms to more than one thousand Angstroms.

Fabrication Methods

The PLEDs of this invention may be fabricated using techniques known in the art, such as solution casting, screen printing, contact printing, precursor polymer processing, melt-processing, and the like to lay down the emissive polymer blend layer 115, hole injection layer 117 and the one or two transport layers 114 and 116. Sputtering, evaporation and the like may be used to lay down the electrode materials in layers 113 and 118 and the passivation materials in layer 112.

In a preferred embodiment, the present invention provides a method for obtaining efficient electrophosphorescent PLEDs by solution processing. The PLED is built up with successive layers as described above. In a most typical embodiment the first of the organic layers, hole injection layer 117 of the bilayer electrode is deposited on a transparent metal/metal oxide electrode 118 itself present on the substrate 119. Layer 117 is cast or printed onto the electrode as a solution. The solvent is removed by evaporation and the next layer in the sequence, hole transport layer 116, is cast onto the previously-deposited layer 117, again as a solution and again with the solvent being removed by evaporation. Next the emissive layer 115 is cast from solution. This solution contains the luminescent polymers and the organometallic emitters that make up the emissive layer. Solvent is removed and the next layer, electron transport layer 114 is deposited as a solution which is dried and overcoated by vacuum depositing electron injection electrode 113 followed by passivation layer 112. In this embodiment it is advantageous if the layers which bound the emissive layers are differentially soluble in a more polar solvent such as water or a relatively polar organic liquid such as a 1 to 3 carbon alkanol, that is methanol, ethanol, propanol or isopropanol or a blend of water and such alkanol and if the solution of luminescent polymers blended with organometallic emitters from which layer 115 is formed is formed in a suitable relatively nonpolar solvent such as a relatively nonpolar organic solvent, especially a relatively nonpolar hydrocarbon or the like. This prevents these successive layers from disrupting, etching and dissolving one another.

By processing the emissive layer and the one or two transport layers from solutions, and particularly solutions in a less polar solvent for the emissive layer and in more polar solvents for the transport layers, the emitted light can be tuned by varying the concentrations. Thus, by processing from solution, efficient white light with stable CIE coordinates, high CRI values and stable color temperature can be achieved from electrophosphorescent PLEDs.

This invention provides white electrophosphorescent PLEDs which have high brightness, stable CIE coordinates close to CIE coordinates (0.333, 0.333) of pure white light, high CRI values and stable color temperature. And more importantly, the white electrophosphorescent PLEDs described herein have CIE coordinates, CIU values and color temperatures that are insensitive to brightness, applied voltages and applied current density.

High brightness, stable CIE coordinates close to those of pure white light (0.333, 0.333) high CRI values, and stable color temperature are critical parameters for light sources that are useful for solid state lighting applications [D. B. Judd and G. Wyszelki, Color in Business, Science and Industry, 3th ed. (John Wiley & Sons) 1975, pp. 91-388; G. Wyszelki and W. S. Stiles, Color Science, 2nd ed. (Wiley, New York) 1982, pp. 117-2321. Thus by processing all active layers from the solutions, high brightness, stable CIE coordinates close to (0.333, 0.333), high CRI values and stable color temperature are obtainable from multilayer white emitting PLEDs. Therefore, this invention discloses a method for obtaining high performance multilayer white PLEDs; a method which is useful for solid state lighting applications.

Mechanism for Generating White Light

The mechanism for achieving white light from the Type I PLEDs of this invention can be described with reference to the representative emissive layer made up of an Ir(HFP)$_3$: PFO-ETM blend. In this case the mechanism involves hole trapping on the Ir(HFP)$_3$ followed by electron trapping on the Ir(HFP)$_3^+$ cation [X. Gong, J.C. Ostrowski, D. Moses, G. C. Bazan, and A. J. Heeger, Appl. Phys. Lett., 2002, 81, 3711]. In this representative white emitting PLEDs, a portion of the injected holes (from ITO/PEDOT:PSS or poly(BTPD-Si-PFCB) and electrons (from the Ca/Ag or Ba/Al) recombine on the PFO-ETM main chain to produce blue and/or green light, [X. Gong, P. Iyer, D. Moses, G. C. Bazan, A. J. Heeger, Adv. Func. Mater., 2003, 13, 325]. Another portion of injected holes and electrons are trapped by Ir(HFP)$_3$ with subsequent emission of red light from the triplet of Ir(HFP)$_3$ [X. Gong, J. C. Ostrowski, D. Moses, G. C. Bazan, A. J. Heeger, M. S. Liu, A. K-Y. Jen, Adv. Mat. 2003, 15, 45; X. Gong, J. C. Ostrowski, D. Moses, G. C. Bazan, A. J. Heeger, J. Poly. Sci. Poly. Phys. 2003, 41, 2691; X. Gong, J. C. Ostrowski, D. Moses, G. C. Bazan, and A. J. Heeger, Appl. Phys. Lett., 2002, 81,3711].

In the Type II PLEDs, such as those made from the blends of Ir(HFP)$_3$:PFO-F(1%):PFO-ETM, injected holes and electrons recombine by two processes; direct recombination on the main chain (PFO-ETM) to produce blue and/or green emission in parallel with electron and hole trapping on the fluorenone units and on the Ir(HFP)$_3$ followed by radiative recombination, with green light from PFO-F (1%) [X. Gong, D. Moses and A. J. Heeger, Synthe. Met., 2004, 141, 171 and red light from the triplet excited state of Ir(HFP)$_3$ [X. Gong, J. C. Ostrowski, D. Moses, G. C. Bazan, A. J. Heeger, M. S. Liu, A. K-Y. Jen, Adv. Mat. 2003, 15, 45; X. Gong, J. C. Ostrowski, D. Moses, G. C. Bazan, A. J. Heeger, J. Poly. Sci. Poly. Phys. 2003, 41, 2691; X. Gong, J. C. Ostrowski, M. R. Robinson, D. Moses, G. C. Bazan, and A. J. Heeger, Adv. Mat., 2002, 14, 581; X. Gong, J. C. Ostrowski, D. Moses, G. C. Bazan, and A. J. Heeger, Appl. Phys. Lett., 2002, 81, 3711].

Approaching Balanced Charge Injection and Transport in White PLEDs

The performance improvements attained by the addition of the hole transport layer and the electron transport layer can be explained by reference to FIGS. 3 and 4. FIG. 3 presents the energy levels of the top of the π-band (highest occupied molecular orbital, HOMO) and the bottom of the π*-band (lowest unoccupied molecular orbital, LUMO) of poly(9,9-dioctylfluorene) end-capped with 5-biphenyl-1,3,4-oxadiazol(PFO-ETM), poly(vinylcarbazole) sulfonic lithium (PVK-SO$_3$Li) and 4-(5-(4-tert-butylphenyl)-1,3,4-oxadiazole-2-yl)-biphenyl-4'-yl sulfonic sodium (t-Bu-PBD-SO$_3$Na) and the work functions of barium (Ba) and poly(3,4-ethylene dioxythiophene): poly(styrene sulfonic acid) (PEDOT:PSS). FIG. 4 shows the corresponding energy levels of PFO-ETM, tris (2,5-bis-2'-(9',9'-dihexylfluorene) pyridine) iridium (111), Ir(HFP)3, and fluorenone.

The HOMO energy level of PVK-SO$_3$Li, at −5.75 eV, is well aligned with the HOMO energy level of PFO-ETM, at −5.80 eV, implying a nearly ohmic contact for hole injection from PVK-So$_3$Li to PFO-ETM. The LUMO of t-Bu-PBD-SO$_3$Na, at −2.60 eV, is −0.10 eV higher than the work function of barium, at −2.70 eV. However, even this small electron injection barrier will be reduced by the formation of an interface dipole layer at the Ba/t-Bu-PBD-SO$_3$Na interface [X. Gong, P. Iyer, D. Moses, G. C. Bazan, A. J. Heeger, Adv. Func. Mater., 2003, 13, 325; A. Rajagopal, C. I. Wu, A. Kahn, J. Appl. Phys., 1998, 83, 2649; S. T. Lee, X. Y. Hou, M. G. Mason, C. W. Tang, Appl. Phys. Lett., 1998, 72, 1593]. Therefore, the use of PVK-SO$_3$Li as the hole injection/transport layer from the anode to the emissive polymer layer and t-Bu-PBD-SO$_3$Na as the electron injection/transport layer from the cathode to the emissive polymer layer results in improved transport and high performance white light-emitting PLEDs (see FIGS. 9-14 for results demonstrating this).

In addition, the HTL and ETL block the transport of the electrons and holes, respectively, at the interface between the semiconducting emissive polymer layer and the HTL and/or ETL, thereby enhancing the probability of radiative recombination within the emissive layer. As a result, higher values of luminous efficiency, power efficiency and luminance are achieved (see FIGS. 11 and 12).

Solid State Lighting

For solid state lighting applications, one should include the light emitted through the surface and edge of the glass/ITO substrate when calculating the total efficiency [H. A. E. Keitz, "Light Calculations and Measurements," 2nd Edition, Macmillan and Co Ltd, 1971; A. D. Ryer, "Light Measurement Handbook." International Light Inc., 1998]. Assuming typical values for the refractive indices of the glass (n=1.5), ITO (n=1.8-2.0) and polymer (n=1.6-1.8), the critical angle, θ, between the direction of the light emitted in the polymer layer and the substrate surface normal is ~36° at the air-polymer interface and ~62° at the glass-polymer interfaces [B. W. D'Andrade, R. J. Holmes, and S. R. Forrest, Adv. Mater., 2004, 16, 624; M. H. Lu, J. C. Sturm, J. Appl. Phys., 2002, 91, 595; J. Kido, Y. Lizurni, Appl. Phys. Lett., 1998, 73, 2721; N.C. Greenham, R. H. Friend, and D. D. C. Bradley, Adv. Mater., 1994, 6, 491]. Light incident on the interface at an angle greater than the critical angle will be totally internally reflected within the glass/ITO and then waveguided within the device. Although some of the guided light escapes by scattering, the remainder is either partially absorbed within the device or coupled out at the edges of the glass/ITO substrate. Theoretically, the fraction of light emitted in the forward direction is 1/(2n2) of the total where n is the index of refraction of emitter layer [N. C. Greenham, R. H. Friend, and D. D. C. Bradley, Adv. Mater., 1994, 6, 491]. More detailed optical modeling predicted (¾n$^2$) as the fraction emitted in the forward direction [J. S. Kim, P. H. Ho, N. C. Greenham, and R. H. Friend, J. Appl. Phys., 2000, 88, 1073]. Through a series of experiments using an integrating sphere, Cao et al. demonstrated that the measured reduction factor is approximately a factor of 2-2.5 less than the theoretical value, (2n$^2$) ≈6 (assuming n=1.7 for emitted layer); i.e. closer to 4n$^2$/3≈3.85 [Y. Cao, I. D. Parker, G. Yu, C. Zhang, and A. J. Heeger, Nature, 1999, 397, 414]. Forrest and colleagues have obtained similar results; in the small device approximation, they found that the total LE is larger by a factor of 1.7~2.4 than observed in the forward viewing direction [B. W. D'Andrade, S. R. Forrest, Adv. Mater., 2004, 16, 1585; B. W. D'Andrade, R. J. Holmes, and S. R. Forrest, Adv. Mater., 2004, 16,624].

EXAMPLES

Example 1

Synthesis of PVK-SO$_3$Li: The sulfonation of PVK was performed by a procedure described in the literature [S. Wang, Z. Zeng, S. Yang, L.-T. Weng, P. C. L. Wong, K. Ho, Macromolecules, 2000, 33, 3232]. The degree of sulfonation of PVK was about 28%. The sulfonated PVK was dissolved in a minimum amount of hot ethanol, and the resulting solution was cooled down to room temperature. To this solution was added excess EtOLi solution in ethanol and white precipitate was formed. The precipitate was collected by filtration, washed with cooled ethanol and dried under vacuum to obtain the lithium salt PVK-SO$_3$Li.

Example 2

Synthesis of t-Bu-PBD-SO$_3$Na: t-Bu-PBD-SO$_3$H was synthesized by a procedure described in the literature [T. J. Boyd, R. R. Schrock, Macromolecules, 1999, 32, 6608]. A concentrated solution of t-Bu-PBD-SO$_3$H in water/THF(v/v 6:1) was added into a salt brine to afford a white precipitate. The precipitate was extracted into ethanol and the ethanol was removed to obtain the desired sodium salt t-Bu-PBD-SO$_3$Na.

Example 3

Three stock solutions, PFO-ETM, PFO-F (1%) and Ir(HFP)$_3$ were prepared by dissolving 50 mg PFO-ETM, 20 mg PFO-F (1%) and 5 mg Ir(HFP)$_3$ into 1 ml toluene, respectively. The resulting 0.5 wt.-% Ir(HFP)$_3$ solution was diluted to 0.05 wt.-% Ir(HFP)$_3$. The mixtures were stirred overnight at 65° C. and then cooled to room temperature.

This example demonstrates that the emissive materials used in the practice of this invention are soluble in common nonpolar organic solvents.

Example 4

Preparation of Type I solution: 2.4 µl of a solution of 0.05 wt.-% Ir(HFP)$_3$ in toluene and 400 µl of a solution of 5 wt.-% PFO-ETM in toluene were added into 197.6 µl of pure toluene.

Preparation of Type II solution: 19.2 µl of a solution of 0.05 wt.-% Ir(HFP)$_3$ in toluene and 400 µl of a solution of wet.-% PFO-ETM in toluene were added into 180.8 µl of pure toluene.

This example demonstrates that solutions of the emissive materials can be made in nonpolar organic solvent at desired concentrations by blending conjugated polymers with organometallic emitters.

Example 5

A solution of 0.5 wt.-% PVK-SO$_3$3Li in ethanol was prepared.

A solution of 0.5 wt.-% t-Bu-PBD-SO$_3$Na in ethanol was prepared.

This example demonstrates that solutions of PVK-SO$_3$Li and t-Bu-PBD-SO$_3$Na can be made at desired concentrations in polar solvents.

Example 6

A PVK-S03Li solution prepared according to Example 5 was spin-cast at 5000 rpm in nitrogen atmosphere onto a preformed hole injection layer of PEDOT:PSS and thereafter baked at about 85° C. in a vacuum oven for 24 hours to yield a hole transport layer 116 on top of a hole injection layer 117. Alternative hole transport layers 116 can be used such as, for example, poly(BTPD-Si-PFCB).

Example 7

Type I and Type II solutions prepared according to Example 4 were spin-cast at 2000 rpm in nitrogen atmosphere onto PVK-SO$_3$Li layers 116 prepared according to Example 6, and thereafter baked at 65° C. in a nitrogen atmosphere for 20 minutes to yield a variety of emissive layers 115 on hole transport layers 116.

Example 8 t-Bu-PBD-SO$_3$Na solution prepared according to Example 5 was spin-cast at 5000 rpm in nitrogen atmosphere onto the emissive layer 115 and thereafter baked at about 95° C. in vacuum oven for 24 hours to yield a representative electron transport layer 114 on emissive layer 115.

Example 9

A Ba electrode 113 (for electron injection) was formed with a thickness of approximate 100 angstroms onto the t-Bu-PBD-S03Na layer 114 and then a protective Al over layer 112 was deposited with a thickness of approximate 2000 angstroms by vapor deposition at 10$^{-6}$ Torr. [X. Gong, J. C. Ostrowski, M. R. Robinson, D. Moses, G. C. Bazan, and A. J. Heeger, Adv. Mat. 2002, 14, 581; X. Gong, J. C. Ostrowski, D. Moses, G. C. Bazan, A. J. Heeger, M. S. Liu, A. K-Y. Jen, Adv. Mat. 2003, 15, 45].

Ca or other low work function metals (and their alloys) can be used for the electron injection layer 113.

The overlayer 112 can be made using any inert metal, for example, silver or gold.

Examples 6-9 together demonstrate that multilayer PLEDs can be fabricated by solution processing the organic layers.

Example 10

FIG. 5 shows the electroluminescent spectra obtained from devices made from pure PFO-ETM, PFO-F (1%) and Ir(HFP)$_3$ doped into PFO-ETM (at a concentration of Ir (HFP)$_3$:/PFO-ETM=1 wt. %). The strong green emission from "blue-emitting" PFO-ETM results from fluorenone defects generated during device fabrication/operation [x. Gong, P. Iyer, D. Moses, G. C. Bazan, A. J. Heeger, Adv. Func. Mater., 2003, 13, 325]. The broad green emission from PFO-F (1%) originates from excitation energy transfer in the copolymer from the PFO-ETM majority component to the fluorenone minority component. [X. Gong, D. Moses and A. J. Heeger, Synthe. Met. 2004, 141, 17]. The red emission with maximum at 600 nm and a shoulder at 620 is the $Ir(HFP)_3$ triplet emission. [X. Gong, J. C. Ostrowski, D. Moses, G. C. Bazan, A. J. Heeger, M. S. Liu, A. K-Y. Jen, Adv. Mat. 2003, 15, 45; J. C. Ostrowski, M. R. Robinson, A. J. Heeger and G. C. Bazan, Chem. Commun., 2002, 7, 784].

Example 11

FIG. 6 shows the electroluminescent spectra obtained from Type I devices at different applied voltages. White light was generated from two components, PFO-ETM and $Ir(HFP)_3$; both blue and green from PFO-ETM [X. Gong, P. Iyer, D. Moses, G. C. Bazan, A. J. Heeger, Adv. Func. Mater., 2003, 13, 325] and red from $Ir(HFP)_3$.

Example 12

FIG. 7 shows the electroluminescent spectra obtained from Type II devices at different applied voltages. In this white light PLED, PFO-F (1%) was added into the PFO-ETM:Ir $(HFP)_3$ blends to fine-tune the color distribution. Therefore, white light was generated by Type II devices from three components, PFO-ETM, PFO-F (1%) and Ir(HFP)3; blue and green from PFO-ETM [X. Gong, P. Iyer, D. Moses, G. C. Bazan, A. J. Heeger, Adv. Func. Mater., 2003, 13, 325] and red from $Ir(HFP)_3$, green from PFO-F (1%) [X. Gong, D. Moses, and A. J. Heeger, Synthe. Met. 2004, 141, 171 and red from $Ir(HFP)_3$.

Example 13

The CIE coordinates, CT and CRI were quantitatively evaluated from the electroluminescence spectra obtained in Example 12 [G. Wyszelki and W. S. Stiles, Color Science, 2nd ed. (Wiley, New York) 1982; D. B. Judd and G. Wyszecki, Color in Business, Science and Industry, 3rd ed. (John Wiley & Sons) 1975].

Example 14

FIG. 8 shows the 1931 CIE chromaticity diagram, with coordinates corresponding to the emission from electrophosphorescent PLEDs: data points are shown for both Type I devices (open squares) and Type II devices (open circles) biased at different applied voltages. For Type I devices, the CIE coordinates shift from (0.328, 0.334) at J=0.10 mA/cm$^2$ to (0.296, 0.290) at J=33 mA/cm$^2$; For Type II devices, the CIE coordinates shift from (0.380, 0.400) at J=0.2 mA/cm$^2$; to (0.346, 0.368) at J=115 mA/cm$^2$. All are very close to the CIE coordinates for pure white light, (0.333, 0.333). The stability of the CIE coordinates as a function of applied voltage is much better than reported previously for white PLEDs/OLEDs [J. Kido, H, Shionoya, K, Nagai, Appl. Phys. Lett., 1995, 67, 2281; Y. Hamada, T. Sano, H. Fujii, Y. Nishio, Jpn. J. Appl. Phys., 1996, 35, L1339; M. Strukelj, R. H. Jordan, A. Dodabalapur, A.; J. Am. Chem. Soc., 1996, 118, 1213; B. W. D'Andrade, R. J. Holmes, and S. R. Forrest, Adv. Mater., 2004, 16, 624; Kido, H. Hongawa, K. Okuyama and K. Nagai, Appl. Phys. Lett. 1994, 64, 815; Y. Z. Wang, R. G. Sun, F. Meghdadi, G. Leising, A. J. Epstein, Appl. Phys. Lett., 1999, 74, 3613].

Example 15

Type I devices have CT ~6400°K. (see FIG. 8), very close to the CT of average daylight (6500°K.), [R. W. G. Hunt, Measuring Color, $2^{nd}$ Ed. Ellis Horwood, 1991] and CRI=92. Type II devices have CT ~4500°K. (see FIG. 4), very close to the CT of sunlight at solar altitude 20° (4700°K.) [R. W. G. Hunt, Measuring Color, 2nd Ed. Ellis Horwood, 1991], and CRI=86 (all values insensitive to J). The specific concentrations used in the Type I and Type II devices were chosen for example only; the CIE coordinates can be changed continuously by changing the composition of the blends. In FIG. 8, the dotted line indicates different color temperatures; the dotted oval indicates the approximate area where the human eye perceives the color as white.

Example 16

FIG. 9 shows the luminance (L) versus voltage (V) and current-density (J) versus voltage (V) characteristics for Type I devices. All devices turn on at approximately 6 V, which is ~1 V higher than the devices without PVK-SO$_3$Li, due to the larger film thickness. Type I devices have $L_{max} \approx 2.4 \cdot 10^4$ cd/m$^2$ at 25 V.

Example 17

FIG. 10 shows the luminance (L) versus voltage (V) and current-density (J) versus voltage (V) characteristics for Type II devices. All devices turn on at approximately 6 V, which is ~1 V higher than the devices without PVK-SO$_3$Li, due to the larger film thickness. Type II devices have $L_{max} \approx 2.4 \times 10^4$ cd/m$^2$ at 25 V.

Example 18

FIG. 11 shows the forward viewing external luminous efficiency ($LE_{ext}$) versus current density, J (mA/cm$^2$) for Type I devices with PEDOT:PSS as the HIL/HTL, t-Bu-PBD-SO$_3$Na as the ETL, and PVK-SO$_3$Li as the HTL and t-Bu-PBD-SO$_3$Na as the ETL, respectively; and the forward viewing external power efficiency ($PE_{ext}$, lm/W) versus J (mA/cm$^2$).

For display applications, a Lambertian intensity profile was assumed; the forward viewing efficiencies, $LE_{ext}$ and $PE_{ext}$ shown in FIG. 11, were measured with the following results: [K. Müllen, Editor, Electroluminescence-from Synthesis to Devices, Wiley-VCH, 2005 (in press). Type I devices have $LE_{ext}$=10.4 cd/A, L=2391 cd/m$^2$ and $PE_{ext}$=3 lm/W at J=23 mA/cm$^2$ (V=11 V); Note that even at J=200 mA/cm$^2$, the Type I devices have L=19500 cd/m$^2$, $LE_{ext}$=9.5 cd/A and $PE_{ext}$=2 lm/W. The $LE_{ext}$ and $PE_{ext}$ at 200 mA/cm$^2$ are significantly higher than any reported previously for white OLEDs and PLEDs [J. Kido, H, Shionoya, K, Nagai, Appl. Phys. Lett., 1995, 67, 2281; C. Zhang, A. J. Heeger, J. Appl. Phys., 1998, 84, 1579; Z. Shen, P. E. Burrows, V. Bulvić, S. R. Forrest, M. E. Thompson, Science, 1997, 276, 2009; Y. Hamada, T. Sano, H. Fujii, Y. Nishio, Jpn. J. Appl. Phys., 1996, 35, L1339; Y. Z. Wang, R. G. Sun, F. Meghdadi, G. Leising, A. J. Epstein, Appl. Phys. Lett., 1999, 74, 3613; M. Strukelj, R. H. Jordan, A. Dodabalapur, A.; J. Am. Chem. Soc., 1996, 118, 1213; B. W. D'Andrade, R. J. Holmes, and S. R. Forrest, Adv. Mater., 2004, 16, 6241.

As shown in FIG. 11, the $LE_{ext}$ from white PLEDs with t-Bu-PBD-SO$_3$Na as is higher than that without t-Bu-PBD-SO$_3$Na. Similarly, the $LE_{ext}$ from white PLEDs with both PVK-SO$_3$Na as HTL and t-Bu-PBD-SO$_3$Na as ETL are higher than that with only t-Bu-PBD-SO$_3$Na as ETL. Therefore, these results demonstrate that white PLEDs comprising HTL and ETL which reduce the energy barriers for hole and electron injection have the highest $LE_{ext}$ and $PE_{ext}$ and, correspondingly, the highest L at a given J.

Example 19

FIG. 12 shows the forward viewing external luminous efficiency ($LE_{ext}$) versus current density, J (mA/cm$^2$) for Type II devices with PED0T:PSS as the HIL/HTL, t-Bu-PBD-SO$_3$Na as the ETL, and PVK-SO$_3$Li as the HTL and t-Bu-PBD-SO$_3$Na as the ETL, respectively; and the forward viewing external power efficiency ($PE_{ext}$/lm/W) versus J (mA/cm$^2$).

The measurement approach of Example 18 was repeated $LE_{ext}$=7.2 cd/A, L=882 cd/m$^2$ and $PE_{ext}$=1.5 lm/W at J=12 mA/cm$^2$ (V=15 V). Note that even at J=200 mA/cm$^2$, Type II devices have L=9600 cd/m$^2$, $LE_{ext}$=4.8 cd/A and $PE_{ext}$=0.65 lm/W. Again, the $LE_{ext}$ and $PE_{ext}$ at 200 mA/cm$^2$ are significantly higher than any reported previously for white OLEDs and PLEDs.

Moreover, as shown in FIG. 12, the $LE_{ext}$ from white Type II PLEDs with t-Bu-PBD-SO$_3$Na as ETL is higher than that without t-Bu-PBD-SO$_3$Na. Similarly, the $LE_{ext}$ from white PLEDs with both PVK-SO$_3$Na as HTL and t-Bu-PBD-SO$_3$Na as ETL are higher than that only with t-Bu-PBD-SO$_3$Na as ETL.

Example 20

For solid state lighting applications, a Lambertian intensity profile was assumed; the total external luminous efficiency ($LE_{total}$) and power efficiency ($PE_{total}$) were measured with the results shown in FIGS. 13 and 14: [N/. C. Greenham, R. H. Friend, and D. D. C. Bradley, Adv. Mater., 1994, 6, 491-494; J. S. Kim, P. H. Ho, N. C. Greenham, and R. H. Friend, J. Appl. Phys., 2000, 88, 1073; Y. Cao, I. D. Parker, G. Yu, C. Zhang, and A. J. Heeger, Nature, 1999, 397, 414; Commission International de l'Éclairage: Measurement of LEDs, CIE publication 127; B. W. D'Andrade, S. R. Forrest, Adv. Mater., 2004, 16, 1585; B. W. D'Andrade, R. J. Holmes, and S. R. Forrest, Adv. Mater., 2004, 16, 624; K. Mullen, Edited, *Electroluminescence-from Synthesis to Devices*, Wiley-VCH, 2005 (in press); M. H. Lu, J. C. Sturm, J. Appl. Phys., 2002, 91, 5951.

FIG. 13 shows the total external luminous efficiency ($LE_{total}$) and the total external power efficiency ($PE_{total}$, lm/W) versus current density J (mA/cM$^2$) for Type I devices with PEDOT:PSS as the HIL, PVK-SO$_3$Li as the HTL and t-Bu-PBD-SO$_3$Na as the EIL/ETL.

FIG. 14 shows the total external luminous efficiency ($LE_{total}$) and the total external power efficiency ($PE_{total}$, MW) versus current density J (mA/cm$^2$) for Type II devices with PEDOT:PSS as the HIL and PVK-SO$_3$Li as the HTL and t-Bu-PBD-SO$_3$Na as the EIL/ETL. As reflected in these Figures, Type I devices have $LE_{total}$=21 cd/A and $PE_{total}$=6 lm/W at J=23 mA/cm$^2$ and Type 11 devices have $LE_{total}$=16 cd/A and $PE_{tota}$=3 lm/W at J=12 mA/cm$^2$.

What is claimed:

1. In an organic polymer-based light-emitting device comprising an electron injection electrode and a hole injection electrode on opposite sides of an emissive layer, the emissive layer comprising at least one luminescent first semiconducting polymer capable of fluorescent emission serving as host to at least one admixed phosphorescent emitter capable of phosphorescent emission, the improvement comprising at least one of:
   an organic electron transport layer comprising a second semiconducting polymer disposed between the electron injection electrode and the emissive layer and having a lowest unoccupied molecular orbital close in energy to the bottom of the Π* band of the luminescent polymer; and
   an organic hole transport layer comprising a third semiconducting polymer disposed between the hole injection electrode and the emissive layer and having a highest occupied molecular orbital close in energy to the top Π band of the luminescent polymer.

2. The light-emitting device of claim 1 comprising an electron transport layer.

3. The light-emitting device of claim 2 wherein the second semiconducting polymer has a lowest unoccupied molecular orbital having an energy level between the bottom of the Π* band of the luminescent polymer and the work function of the electron injection electrode.

4. The light-emitting device of claim 1 comprising a hole transport layer.

5. The light-emitting device of claim 4 wherein the third semiconducting polymer has a highest occupied molecular orbital having an energy level between the top Π band of the luminescent polymer and the work function of the hole injection electrode.

6. The light-emitting device of claim 1 wherein the hole injection electrode is a bilayer electrode itself comprising a high work function electrode and an organic hole injection layer between the high work function electrode and the emissive layer.

7. The light-emitting device of claim 1 wherein the emissive layer comprises a conjugated polymer.

8. The light-emitting device of claim 1 wherein the emissive layer comprises a single phosphorescent emitter and wherein the first semiconducting polymer serves as host to the phosphorescent emitter.

9. The light-emitting device of claim 1 wherein the emissive layer comprises two or more phosphorescent emitters and wherein the first semiconducting polymer serves as common host to the two or more phosphorescent emitters.

10. A multilayer organic polymer-based light-emitting device comprising in layer order one to another: a low work function electrode, an organic polymer-based electron injection/transport layer, an emissive layer comprising a semiconducting organic polymer and at least one phosphorescent emitter, an organic polymer-based hole transport layer, and a high work function electrode.

11. The light-emitting device of claim 10 additionally comprising a substrate and a protective layer, one of which is positioned adjacent to the low work function electrode and the other of which is positioned adjacent to the high work function electrode, and at least one of which is transparent to at least a portion of light produced in the emissive layer.

12. The light-emitting device of claim 10 wherein the emissive layer comprises a semiconducting polymer differentially soluble in nonpolar solvents and the transport layers each comprise a polymer differentially soluble in polar solvents.

13. The light-emitting device of claim 10 wherein the emissive layer comprises a conjugated polymer.

14. The light-emitting device of claim 10 wherein the emissive layer additionally comprises a single phosphorescent emitter and wherein the semiconducting polymer serves as host to the phosphorescent emitter.

15. The light-emitting device of claim 10 wherein the emissive layer additionally comprises two or more phosphorescent emitters and wherein the semiconducting polymer serves as common host to the two or more phosphorescent emitters.

16. The light-emitting device of claim 10, wherein the emissive layer comprises: a. at least one organic polymeric fluorescent emitter, and b. at least one phosphorescent emitter in intimate admixture as a single emissive region; and wherein the emission from the at least one organic polymeric fluorescent emitter is higher in photon energy than the emission from the at least one phosphorescent emitter, and wherein the combined emission of the at least one organic polymeric fluorescent emitter and the at least one phosphorescent emitter sufficiently spans the visible spectrum to give a white emission.

17. The A multilayer organic polymer-based light-emitting device comprising in layer order one to another: a low work function electrode, an organic polymer-based electron injection/transport layer, an emissive layer comprising a semiconducting organic polymer and at least one phosphorescent emitter, an organic polymer-based hole transport layer, and a high work function electrode;
wherein the high work function electrode is a bilayer electrode itself comprising a high work function layer and an organic polymer-based hole injection layer between the high work function layer and the hole transport layer.

18. In an organic polymer-based white light-emitting device comprising an electron injection electrode and a hole injection electrode on opposite sides of an emissive layer, the emissive layer comprising at least one luminescent first semiconducting polymer capable of fluorescent emission serving as host to at least one admixed phosphorescent emitter capable of phosphorescent emission, wherein the device, at $J=200$ mA/cm$^2$, L equal to at least about 10000 cd/m$^2$, $LE_{ext}$ equal to at least about 10 cd/A and $PE_{ext}$ equal to at least about 2 lm/W.

19. The light-emitting device of claim 18, wherein the device comprises an emissive layer comprising a single phosphorescent emitter.

20. The white light-emitting device of claim 19 having a color temperature of about 6400°K.

21. The white light-emitting device of claim 18 being a Type II device, wherein the device comprises an emissive layer comprising two or more phosphorescent emitters.

22. The white light-emitting device of claim 18 emitting light having a color rendering index in excess of 80.

23. The white light-emitting device of claim 21 having a color temperature of about 4700°K.

24. The white light-emitting device of claim 22 fabricated as a multilayer device by sequential solution processing and being suitable for solid state light applications.

25. The white light-emitting device of claim 22 having, at $J=23$ mA/cm$^2$, luminance equal to at least about 20000 cd/m$^2$, $LE_{total}$ equal to at least about 20 cd/A and $PE_{total}$ equal to at least about 6 lm/W and being suitable for solid state light applications.

26. In an organic polymer-based light-emitting device comprising an electron-injection layer and a hole-injection layer on opposite sides of an emissive layer, the emissive layer comprising at least one luminescent first semiconducting polymer capable of fluorescent emission serving as host to at least one admixed phosphorescent emitter capable of phosphorescent emission, the improvement comprising at least one of an organic electron transport layer comprising a second semiconducting polymer disposed between the electron injection layer and the emissive layer and having a lowest unoccupied molecular orbital close in energy to the bottom of the Π band of the luminescent polymer an organic hole transport layer comprising a third semiconducting polymer disposed between the hole injection layer and the emissive layer and having a highest occupied molecular orbital close in energy to the top Π band of the luminescent first semiconducting polymer, said first semiconducting polymer being differentially soluble in a first solvent and at least one of said second and third semiconducting polymers being differentially soluble in a second solvent, said first and second solvents differing in polarity from one another.

27. The light-emitting device of claim 26 wherein the first solvent is less polar than the second solvent.

28. The light-emitting device of claim 27 wherein the first solvent comprises a liquid hydrocarbon and the second solvent comprises a lower alkanol.

29. A method for fabricating a light-emitting device of claim 26 which comprises laying down the emissive layer as a solution in said first solvent and evaporating the first solvent and laying down the at least one of the electron transport layer and the hole transport layer as a solution in said second solvent and evaporating the second solvent.

30. The method of claim 29 wherein the solvent evaporating is completed for a first layer before a second layer is laid down.

31. The method of claim 29 comprising laying down both an electron transport layer and a hole transport layer and wherein the hole transport layer is laid down first, followed by the emissive layer and thereafter followed by the electron transport layer.

32. The method of claim 31 wherein the solvent for the emissive layer solution is a more nonpolar solvent and wherein the solvent for the electron transport layer solution is the same or different than the solvent for the hole transport layer solution with the solvents for the transport layer solutions being more polar than the solvent for the emissive layer.

33. The method of claim 32 wherein the solvent for the emissive layer comprises a nonpolar hydrocarbon and wherein the solvents for the transport layers comprise a lower alkanol.

* * * * *

UNITED STATES PATENT AND TRADEMARK OFFICE
CERTIFICATE OF CORRECTION

PATENT NO. : 8,076,842 B2  Page 1 of 1
APPLICATION NO. : 11/366186
DATED : December 13, 2011
INVENTOR(S) : Gong et al.

It is certified that error appears in the above-identified patent and that said Letters Patent is hereby corrected as shown below:

In the Claims

Column 19

Claim 17, Line 17, please delete word "The" before the word "A";

Column 19

Claim 20, Line 42, please delete "6400°K" and insert --6400K--; and

Column 19

Claim 23, Line 49, please delete "4700°K" and insert --4700K--.

Signed and Sealed this
Eleventh Day of February, 2014

Michelle K. Lee
*Deputy Director of the United States Patent and Trademark Office*